United States Patent [19]
Ott

[11] Patent Number: 6,140,830
[45] Date of Patent: Oct. 31, 2000

[54] ADAPTER SYSTEM FOR COMPONENT ASSEMBLY CIRCUIT BOARDS, FOR USE IN A TEST DEVICE

[75] Inventor: Rainer Ott, München, Germany

[73] Assignee: Test Plus Electronic GmbH, Munich, Germany

[21] Appl. No.: 08/737,014

[22] PCT Filed: Mar. 1, 1996

[86] PCT No.: PCT/EP96/00880

§ 371 Date: Feb. 6, 1997

§ 102(e) Date: Feb. 6, 1997

[87] PCT Pub. No.: WO96/27136

PCT Pub. Date: Sep. 6, 1996

[30] Foreign Application Priority Data

Mar. 1, 1995 [DE] Germany .......................... 195 07 127

[51] Int. Cl.[7] .................................................. G01R 1/073
[52] U.S. Cl. ........................................... 324/761; 324/758
[58] Field of Search .................................. 324/761, 754, 324/758

[56] References Cited

U.S. PATENT DOCUMENTS

| | | | |
|---|---|---|---|
| 4,774,462 | 9/1988 | Black | 324/758 |
| 4,833,402 | 5/1989 | Boegh-Petersen | 324/754 |
| 4,977,370 | 12/1990 | Andrews | 324/761 |
| 5,157,325 | 10/1992 | Murphy | 324/761 |
| 5,534,784 | 7/1996 | Lum et al. | 324/761 |
| 5,574,382 | 11/1996 | Kimura | 324/754 |
| 5,818,248 | 10/1998 | St. Onge | 324/758 |

FOREIGN PATENT DOCUMENTS

| | | |
|---|---|---|
| 0 180 013 | 5/1986 | European Pat. Off. . |
| 87 08 943 | 1/1988 | Germany . |
| 2 214 362 | 8/1989 | United Kingdom . |

Primary Examiner—Ernest Karlsen
Attorney, Agent, or Firm—Scully, Scott, Murphy & Presser

[57] ABSTRACT

The invention relates to a test device for component assembly circuit boards (31), in which this test device includes a plurality of test channels which are contact-connected with respective test points (32) of the board (31) by means of spring contact pins (2, 3), whereby in accordance with the invention for the contacting of the spring contact pits with the terminals of the test channels (29) there is provided a raster plate (21) which has contact surfaces (22) on the side to be contacted with the spring contact pins, of which contact surfaces in each case n contact surfaces are electrically parallel-connected with .one another and connected with a respective test channel, whereby the test surfaces (No. 1, No. 2, . . . , No. 21, No. 41, . . . ) of the test channels ($a_1$, $a_2$, . . . $b_1$, . . . $c_1$, . . .) are positioned on this outer surface of the raster plate distributed mixed with one another.

(FIG. 1)

22 Claims, 14 Drawing Sheets

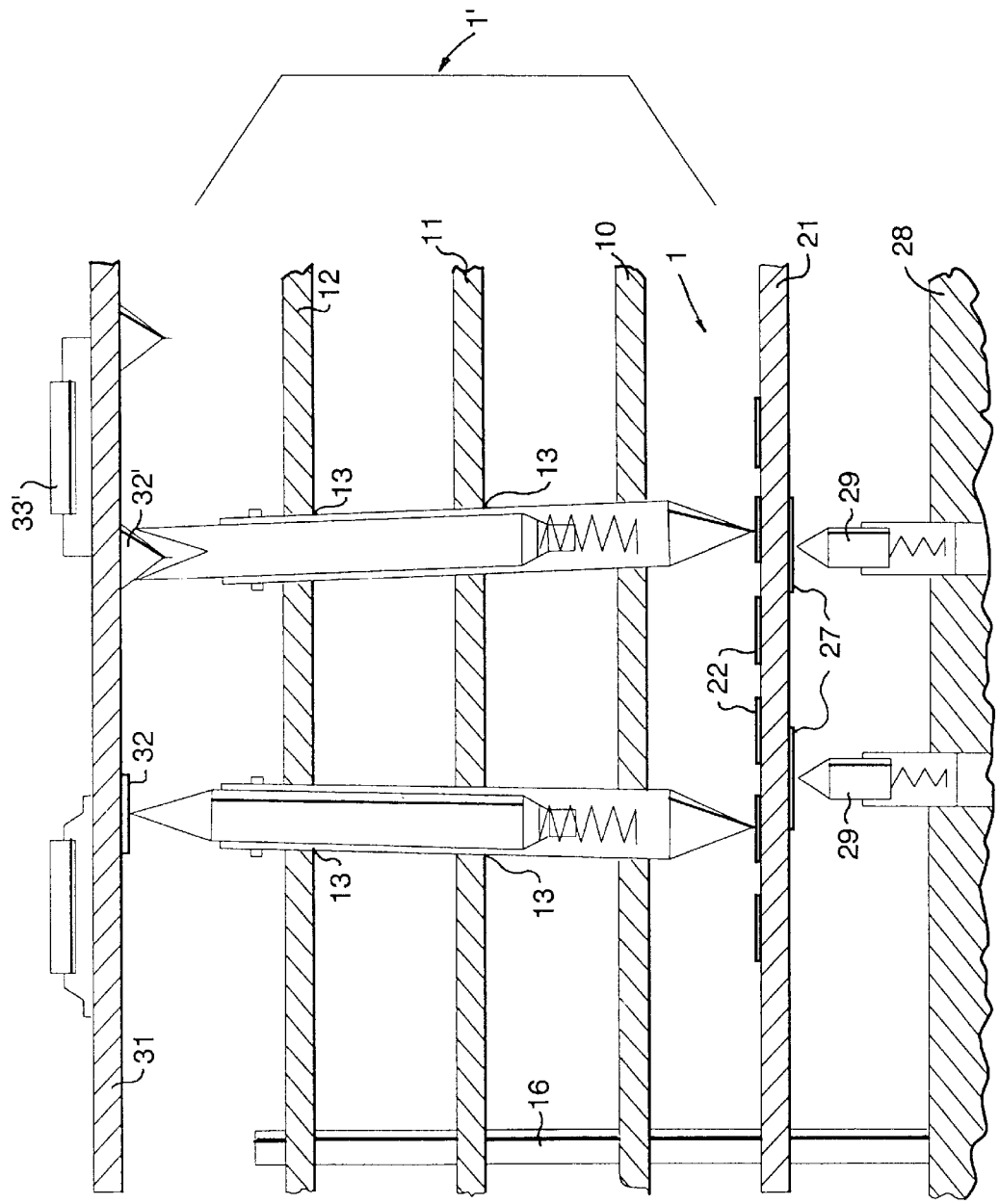

Overall Sequence Of The Data Generation

ADAPTER SYSTEM FOR COMPONENT ASSEMBLY CIRCUIT BOARDS, FOR USE IN A TEST DEVICE

BACKGROUND OF THE INVENTION

The present invention relates to an adapter system for component assembly circuit boards, such as are employed in great number and in the most various designs in electronic apparatuses of the most varied size. Such circuit boards have individual electronic components mounted on them.

On such an component assembly circuit board there are a plurality of components, component assemblies and the like, and numerous contact and solder points are present, for which the possibility cannot be excluded that a component, a solder point or the like could be defective. As a result of such a defect, the complete component assembly board is for the most part not useable and would not be tolerable if built into an electronic apparatus, or would lead to complaints from the customer. It is thus provided to test the component assembly circuit boards for complete freedom from faults, each individually, in accordance with a test program to be determined. Thereby, inter alia, the large number of contact points are to be tested with a view to determining whether the conductor paths, components and assemblies present on the board between them have the required electronic properties. Clearly, this can be economically effected only by means of an automatically functioning test device, which tests at predetermined test points of the board the conductor path connections and the elements with which this component assembly circuit board is mounted. For such a testing which runs automatically, checking/test devices have been developed and are available which e.g. have in one plane a large number of contacts, e.g. spring contact tips. These contact tips are the respective external terminals of the test channels of the checking/test device, whereby the functions of the individual test channels are set in accordance with a standard. When the test points of a component or of a component assembly are connected each with such a contact tip, i.e. with a test channel of the test device, the connected element of the component assembly circuit board can be checked with regard to its freedom from faults with the test device.

There are known, e.g. from DE-A-4,226,069, standardized test devices with in each case a specific adapter part with which selected electrical connections between respective test points of an component assembly circuit board and respective contact tips of the test device are established. For this purpose, the plane of these contact tips and the component assembly circuit board are arranged parallel to one another and one above another with a spacing, and contact elements are located in the space between the board and the test device which contact elements establish these connections in a selected manner for the case concerned. For this purpose it is usual to provide respective pairs of contact pins connected with one another by an electrical wire, of which the one pin contacts the selected test point and the other pin contacts the respective associated selected contact tip of the test device.

With such known arrangements it is disadvantageous that individual, in some cases long, wire connections between the pins of a respective pair are to be provided, which give rise to high production costs and which may have undesirable effects in relation to high frequencies. Also, the manipulation therewith and the placement of the contact pin pairs is inconvenient and time consuming. Further, with this technique, problems can appear particularly in the case of circuit boards having higher packing density, because the available space is not always sufficient for the two pins respectively required per contact connection.

From EP-0233992 A1 there has been known for almost a decade a further test device having an adapter for contacting matching to a respective component assembly circuit board, and this device is in use. The adapter has first spring contact pins, fastened in a first plate, which pins correspond to the required contacting of test points of the circuit board, are directed towards the board and are positioned distributed over the plate with regard to the area thereof. Second contact pins of constant length are fastened in this plate, directed towards the test device, which second contact pins are each positioned associated with a respective one of the first spring contact pins, neighbouring that first spring contact pin. These respective pairs of contact pins are electrically connected with one another by wires. This known adapter also includes a second plate with the funnel-like holes of which, directed towards the second contact pins, the bendable contact ends of the second contact pins are so directed, upon pushing of the plate onto the ends of these contact pins, that the contacting ends meet the selected spring contact tips of the test device. With this known adapter there are always provided two pins of a pin pair for a respective connection between the contact tip of the test device and the test point of the board. For a respective connection there is thus needed space for two pins alongside one another. In the region of the connection of a large component module on the circuit board this requirement is not always satisfied.

From DE-A-3,248,694 there is known a further adapter system having a conductor path plate which is arranged between the test pin tips of the test device, which are positioned in a standard manner, and the likewise usual spring contact pins, with which the individual test points of the circuit board are contacted. The conductor paths of this plate are provided individually adapted to the circuit board concerned so that with these conductor paths, that is just as with the wires of the above-mentioned known designs, the respective lateral offsets of associated test contact tips and test points on the board is bridged. With the adapter system of this publication also, for each new circuit board a new conductor path plate with the specifically matched conductor pattern has to manufactured, and this plate also is usable as adapter only for this board.

From EP-0374434 A1 there is known still a further test device, however having a kind of universe adapter. There, in a first adapter plate for universal use, there are placed, one against another, axially displaceable contact pins of constant length. In an associated second adapter plate, individual pins for the specific use are mounted in selected positions, which pins can lift up the pins of the first adapter plate arranged in correspondence to this selection and thus bring only these pins into contact with respective test points of the board. The pins of the second plate are electrically connected with the terminals of the test device by respective moveable wire connections. The second plate provided with the pins is equipped in a manner individually adapted to the board to be tested.

SUMMARY OF THE INVENTION

The disadvantages mentioned above are removed with the present invention, which moreover offers further advantages as set out below.

The invention is a device as set out in claim 1, and further configurations of the invention are indicated in the subclaims.

The present invention resides primarily in a universally employable raster plate in accordance with the invention, associated with a test device, having furthermore a selection of the arrangement of contact surfaces in accordance with the invention. Further developments relate to more specific configurations of the raster plate and specific provisions involving the employment of special spring contact pins.

In the following description the invention will be further explained in detail and with reference to the accompanying Figures.

BRIEF DESCRIPTION OF THE DRAWINGS

FIG. 1 shows an basic representation of an adapter employed with the invention, having a raster plate in accordance with the invention.

DETAILED DESCRIPTION OF THE PREFERRED EMBODIMENTS

Figure 11:
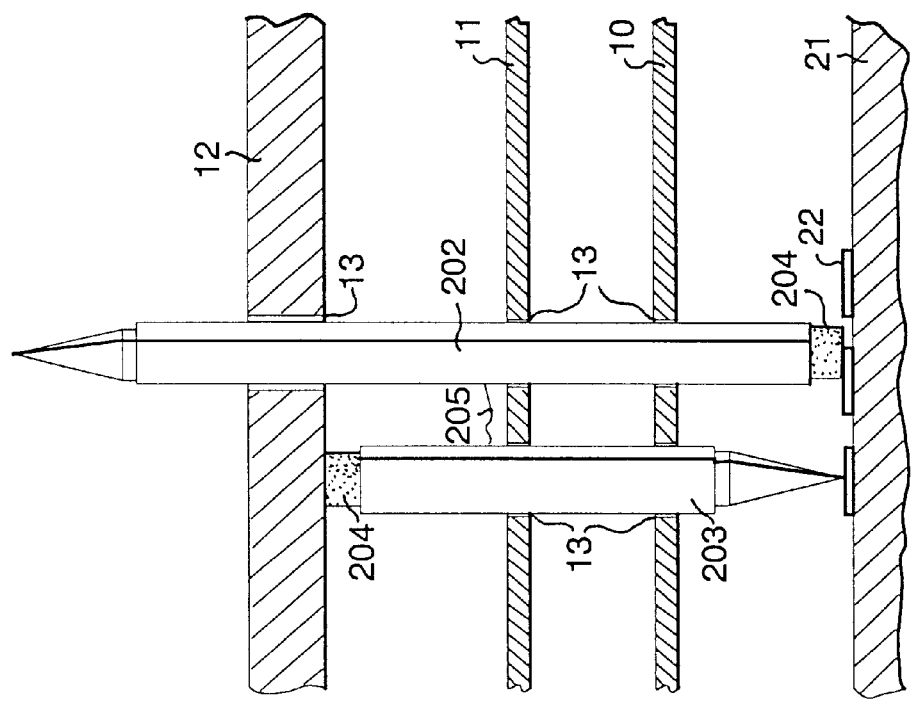
FIG. 11 shows a configuration of a spring contact pin pair employable for special cases with the invention.

Test devices 28, which have upwardly directed—in the illustration of FIG. 1—spring contact tips 29 are known; such a contact being provided for each channel of the test device. In accordance with the invention, a raster plate 21 is provided which in accordance with one embodiment is adapted to the test device 28. This raster plate 21 has contact surfaces 22 on its upper—in FIG. 1—outer surface. Further contacting surfaces 27 are provided on its underside. Of these, each has electrical contact with a respective one of the contact tips 29 of the test device 28, namely when the raster plate 21 is placed on the field of the contact tips 29.

As will be explained in more detail below, the number of contact surfaces 22 of the upper side of the raster plate 21 is, in accordance with the invention, n-times larger than the number of contact surfaces 27 of the underside, the number of which contact surfaces on the underside is usually provided equal to the number of the spring contact tips 29. With particular selection and configuration of the potential—(Vcc)—and ground terminals, the indicated relationships may however be somewhat altered.

On/in the raster plate 21, in each case n contact surfaces 22, as a group No.1, No.2,..., are electrically connected with a respective contact surface of a respective terminal 27. By means of the contact of a contact tip 29 with the contacting surface of a terminal 27 these n contact surfaces 22 are thus connected with a respective associated test channel of the test device. How these in each case n contact surfaces 22 of one group are distributed/positioned on the raster plate 21 mixed together with the respective n contact surfaces of other groups—which are connected each with one of the other contacting surfaces of the terminals 27—will be described in more detail below with reference to several exemplary embodiments.

It should be noted that in accordance with the invention the raster plate 21 may also be a part of the test device 28, so that to this extent this test device is individually configured in accordance with the invention in this manner. The individual test channels of the test device are then, in a manner not previously known, directly connected to the contacting surfaces 27 or corresponding terminals (whereby the field of spring contact tips 29 can be dispensed with).

FIG. 1 shows—designated by 1'—an adapter part, configured and employed in accordance with a further aspect of the invention, for the mounting of spring contact pins employed specifically for the invention, of which two pins 2, 3 are illustrated here. 10, 11 and 12 designate guide hole plates specific to the invention, of which at least two are necessary, three being illustrated here, which hole plates serve for guiding the pins 2 and 3. Each of these guide hole plates has bores 13 through which bores the spring contact pins are guided. The hole plates 10, 11 and 12 are, as shown, arranged at a spacing from one another and the bores 13 are positioned in the individual hole plates above one another or more or less offset one to another. In this way, the spring contact pins 2, 3 receive a predeterminable defined direction in the space between the raster plate 21 and the component assembly circuit board 31 which are both arranged in reference to the adapter part 1, as described in more detail. Through the defined guiding achieved by means of the bores 13, which intentionally in accordance with the invention is also in particular obliquely directed, test points 32 of the board 31 and contact surfaces 22 of the raster plate 21 can be connected with the invention in each case with only a single spring contact pin 2, 3, even if the test point 32 and the contact surface 22 (referred to the normal direction of the board 31 and the raster plate 21) are positioned offset laterally one with respect to the other. This oblique direction is stable, i.e. the spring contact pins 2, 3 cannot, in accordance with the invention, shift laterally in any way.

As can be seen from FIG. 1, such spring contact pins have oblique positions which are very differently directed to one another.

In order to indicate an exemplary size relationship for an arrangement in accordance with FIG. 1, for example 60 mm may be mentioned for the spacing between the raster plate 21 and the component assembly plate 31. The spacing of neighbouring contact surfaces 22 of a raster plate 21 in accordance with the invention is provided as e.g. about 1 mm. A normal raster dimension of components of the component assembly circuit board is e.g. 1.27 mm. The two test points 32, 32' on the component assembly circuit board, contacted in FIG. 1 with spring contact pins, to which test points the components 33 and 33' are connected each with a respective terminal, have in practice a spacing from one another which is several times this raster dimension 1.27 mm. Merely for the purpose of completeness, it is noted that the component terminals at the test points 32, 32'..., as can be seen from FIG. 1, may be differently configured and that spring contact pins having correspondingly adapted contact ends are employed. A test device has e.g. 1000 test channels and the number (n-times so many) of contact surfaces 22 may be e.g. 50000. How many test points 32 of the board are to be contacted depends upon the individual case, i.e. depends upon the specific board.

Figure 2:
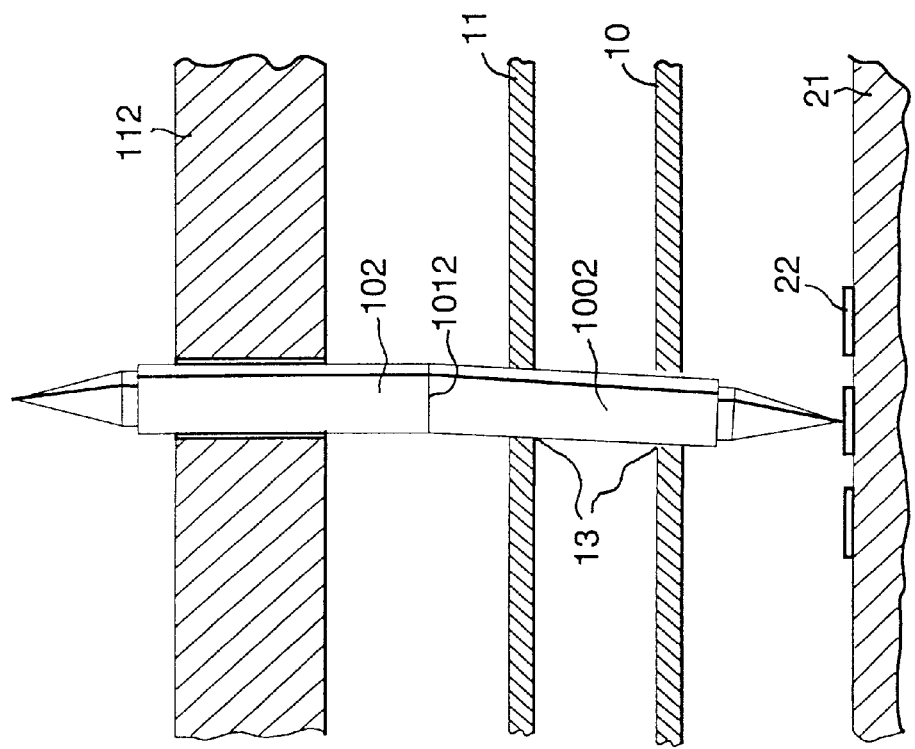
FIG. 2 shows, supplementing FIG. 1, a particular configuration of a spring contact pin which can be employed with the invention.

The component assembly circuit board 31 is held in a mounting provided for it (which mounting is not discussed in more detail because it is known) so that the predetermined defined spacing to the test device 28 or to the raster plate 21 is complied with, even against the spring forces of a great number of spring contact pins 2, 3, . . . As mounting for component assembly circuit boards there are usual in practice mechanically effective clamps or suction by means of vacuum techniques. For the latter case, a vacuum tight sealing below the board 31 is needed. From the state of the art it is known to employ for this purpose spring contact pins whose outer sleeves, namely as shown in FIG. 2, are placed in a plate 112 in a vacuum tight manner. Per se, this would hinder the oblique positioning of the spring contact pins, namely as shown in FIG. 1, which oblique positioning is not only permitted in accordance with the invention but represents a possibility for further development of the invention. For this case, there are provided for the invention specific spring contact pins 102 which have a part piece 1002 which is deflectable in terms of direction. 1012 indicates a joint which—because of the per se only slight necessary deflection—can be realised relatively simply e.g. as a rubber joint (with electrical bridging), as a ball joint, a spring joint and the like. Such a contact spring pin should have, above and below the fixed engagement in the plate 112, a spring contact pin, e.g. in accordance with any known configuration.

Also with the configuration according to FIG. 2, there is to be provided for the plate 112 at least one further guide hole plate 10, namely for the pin part 1002 to be deflected.

The guide hole plates are, in accordance with the individual case, provided with bores 13 and are so rigidly connected—above one another, at a spacing from one another—that subsequent lateral displacements of the hole plates 10, 11, 12 (112) relative to one another are excluded. This is effected with e.g. conventional mechanical means, e.g. (not shown) connection rods 16, with which the adapter part is further also to be held relative to the raster plate 21, displacement-free and with defined spacing.

Below, starting from the state of the art, a significant further part of the invention will be described.

In accordance with the practice of the state of the art, in order to connect a particular test point of an component assembly circuit board with the contact surface of a suitable test channel of a test device, the above explained spring contact pin pairs with wire connection are employed in the state of the art. Thus, it represented no real problem to find in the vicinity of the test point, at least in the wider vicinity of the test point, such a test channel from amongst the test channels offered by the test device which is not already otherwise occupied, whereby lateral offset of the test point and the associated contact surface of the test channel one to another was not a significant consideration. Such an offset of test point and contact surface relative to one another can, in accordance with the state of the art, be up to a hundred times the raster size without difficulty. Clearly such is impossible for an adapter part in accordance with the invention, having only single spring contact pins, since these—as can also be seen from FIG. 1—allow only slight lateral offset of the test point and the contact surface to be connected with one another, i.e. permit only slight oblique positioning of the—in each case only single—contact pin employed therefor.

In accordance with an embodiment of the invention, however, there are to be worked with (in substance) only such single spring contact pins as shown in FIG. 1. The advantage of this limitation lies in that the placement of the spring contact pins in the adapter part 1—consisting of at least two hole plates 10, 11, 12—is very substantially simplified relative to the assembly of a known adapter part with the spring contact pin pairs placed therein. A matter to be taken into account is that adapter parts associated with particular component assembly circuit boards have to be stored in production plants, but with the invention—for reasons of costs saving—these adapter parts can also be kept without spring contact pins located therein. The spring contact pins, which represent a not insignificant investment, are advantageously used in the interim or re-employed many times, and are also employed again in an adapter part in which they have already been used at some time in the past.

With knowledge of the invention it is clear that such externally smooth spring contact pins as are shown in FIG. 1 and as are employed in the invention can be placed into a prepared or already available adapter part with very little effort, and after use of this adapter part can also be just as easily removed again. The putting in place can be effected in simple manner in that one slides a bundle of spring contact pins, upright, above the for example upper hole plate of the adapter part and allows one of the spring contact pins of the bundle to fall into each individual hole of this (upper) hole plate.

Above, it is already indicated that with the invention there is associated with each channel of the test device in each case an n-times greater number of contact surfaces 22 on the raster plate 21. This, and the distribution of these contacts surfaces 22 described below—forming a further aspect of the invention—serves the purpose of making possible the preferred, advantageous, practical and where possible exclusive employment of only single spring contact pins 2, 3.

There can be provided many schemes of arrangement for the distribution amongst one another of the contact surfaces 22 of different test channels, with which the presence or accessability of or to the individual test channels of the test device can be made more or less evenly distributed over the whole surface of the raster plate 21. With more or less uniform distribution of the accessability of the test channels on the raster plate 21 it is possible to achieve that from any test point 32 (of any board 31 to be tested)—in its vicinity (below), on the raster plate—a contact connection with one of many selectable test channels can be established with one single contact pin 2, 3. In order to realize this, there is provided with the invention (as already indicated in FIG. 1) that such single spring contact pins 2, 3 are employed also in oblique position, namely retained obliquely by means of the adapter part 1'. Clearly, however, only a degree of maximum oblique positioning to be predetermined can be allowed.

A predetermined degree of maximum oblique positioning of an individual spring contact pin 1, 2, . . ., i.e. a tolerable degree of lateral offset, is for example restricted to plus/minus the (diagonal) raster dimension of the contact surfaces of the contact plate 21, i.e. for example restricted to the amount plus/minus 1,4 mm. That means that for example starting from a test point 32 to be connected with a test channel, by means of the spring contact pin 2, 3, . . . only the contact point lying (substantially) vertically therebelow and selectively one of the eight further contact points present in the surface which directly surround this contact point vertically below, can be contacted. This means that, taking into account the above-mentioned restriction, starting from this test point 32 selectively nine contact points 22 can be aimed for. Thus, if the contact point 22 lying vertically below the test point 32 is that of an already occupied test channel (or a test channel which for circuitry reasons cannot be employed here)—which channel is thus not available—or if this is a Vcc or ground terminal connected with no test channel, then with the spring contact pin—by means of selected positioning of the bores 13 in the hole plates 10, 11, 12 (as shown in FIG. 1)—starting from the test point 32 there can be contacted a neighbouring contact surface 22 of another test channel.

Figure 3:
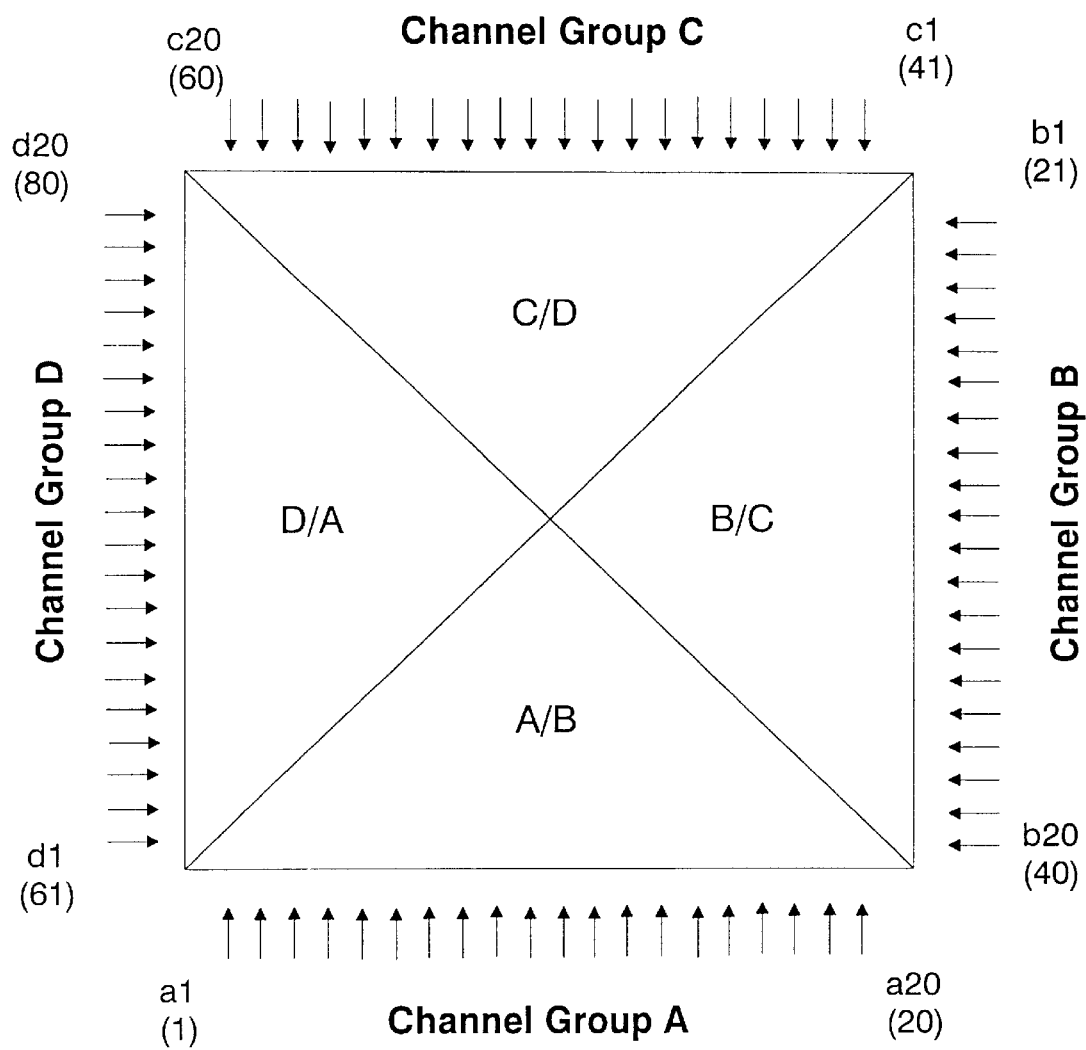
FIGS. 3 to 5 show schemes of an example of a distribution/arrangement of the contact surfaces of the raster plate of the invention, in accordance with the invention.

FIG. 3 shows as a first example an arrangement or distribution of the contact surfaces of a raster plate configured in accordance with the invention, which arrangement or distribution is generally preferred for the invention. The raster plate—assumed to be quadratic merely for the purpose of simple explanation—is conceptually divided into the four sectors A/B, B/C, C/D and D/A. At the outer edge of the sector A/B, one quarter (=a) of all test channels available are connected. In FIG. 3, merely by way of example, only 20 channels $a_1$ to $a_{20}$ are indicated for the sector A/B. A further quarter of the available test channels $b_1$ to $b_{20}$ are connected at sector B/C. The like applies to the two further sectors. In the sector A/B one half of the contact surfaces 22 present there are connected with channels $a_1$ to $a_{20}$ and the other half are connected with other test channels, here for example with the test channel $b_1$ to $b_{20}$. This means that in the sector A/B contact surfaces 22 of the channels $a_1$ to $a_{20}$ and $b_1$ to $b_{20}$ are accessible, and are all distributed amongst one another. In sector A/B it is thus possible, with the inclusion of an oblique positioning of the respective single spring contact pin, to provide contact connections from test point 32 to the half of all available channels, with such a single spring contact pin 2, 3. In sector B/C there are available, in the same manner, the contact surfaces of test channels $b_1$ to $b_{20}$ and $c_1$ to $c_{20}$, whereby the channels $c_1$ to $c_{20}$ are connected for example at the outer edge at the sector C/D. The like applies to the sectors C/D and D/A. In sector C/D contact surfaces of the test channels $c_1$ to $c_{20}$ and $d_1$ to $d_{20}$ are available, and in sector D/A contact surfaces of the test channels $d_1$ to $d_{20}$ and $a_1$ to $a_{20}$ are available. Clearly, in two neighbouring sectors taken together (e.g. A/B and B/C) contact surfaces of three quarters of all test channels present are available. Such a distribution amongst one another of the contact surfaces associated with the test channels is, in the sense of the invention, a sufficiently even distribution even if, as can be seen, regions of the raster outer surface can be indicated in which not all channels present are available next to one another. This is valid for the invention also because, in accordance with a further development of the invention, there is additionally made available a recursive selection process.

Figure 4:
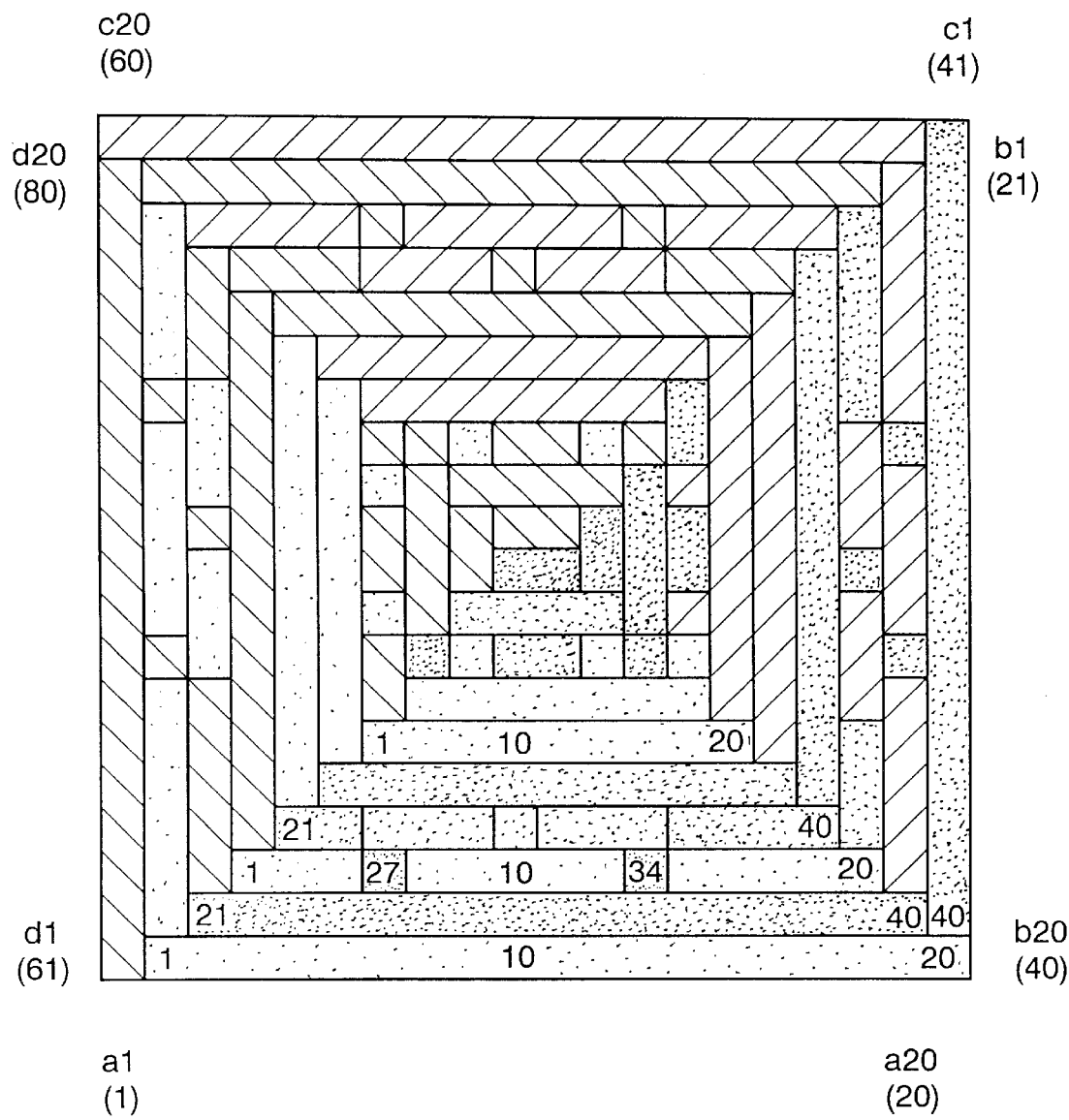

FIG. 4 shows, as a detail, how in accordance with a preferred further configuration of the exemplary embodiment of FIG. 4, the test channels could be distributed with their respective multiple contact surfaces distributed in the plane, within a respective sector.

FIG. 4 shows for the sector A/B how the contact surfaces of the test channels $a_1$ to $a_{20}$ and $b_1$ to $b_{20}$ can be advantageously distributed amongst one another linewise and linenested. The lowest line of sector A/B in FIG. 4 contains, next to one another, contact surfaces of the channels $a_1$ to $a_{20}$. The second line, lying thereabove—lying further inwardly and thus shortened in its length contains the contact surfaces associated with the test channels $b_1$ to $b_{20}$, designated in FIG. 4 with the numbers 21 to 40, except for the contact surfaces No. 27 and No. 34 which (due to the shortening of the line) are introduced into the line lying next above, the third line. Further, this third even shorter line again contains contact surfaces No. 1 to No. 20 belonging to the channels $a_1$ to $a_{20}$, except for six contact surfaces which are already introduced into the line thereabove, the fourth line. The fourth line and in the case of this example the fifth line completely, again contains contact surfaces No. 21 to No. 40 of the group of the test channels, b to $b_{20}$.

It is to be taken into account that in practice the number of the channels and thus the number of the contact surfaces is very much greater and thus the distribution is very much finer than it might be assumed on the basis of the simplified example of FIG. 4.

In the component assembly circuit board to be tested, for some test processes the part regions to be individually tested must be controllably supplied with electrical voltage, and this generally without other part regions—which are not at the moment to be tested—being placed in operation through applied voltage. It is correspondingly useful, just as one contacts individual test points, also to effect earthing and the current supply from the test device into the board to be tested by means of spring contact pins. For this purpose, some contact surfaces are connected with ground or with operating voltage (controllably fed from the test device). Thus, together with the above-described distribution of the contact surfaces and test channels with one another, there is also the distribution of ground and potential terminals. For example then, instead of the above-indicated nine selection possibilities there may be available e.g. only eight possibilities and the ninth possibility is reserved for the voltage supply. However, this constitutes no practical restriction of the utility of the invention, since the possibilities for variation available in accordance with the invention are very large.

Figure 5:
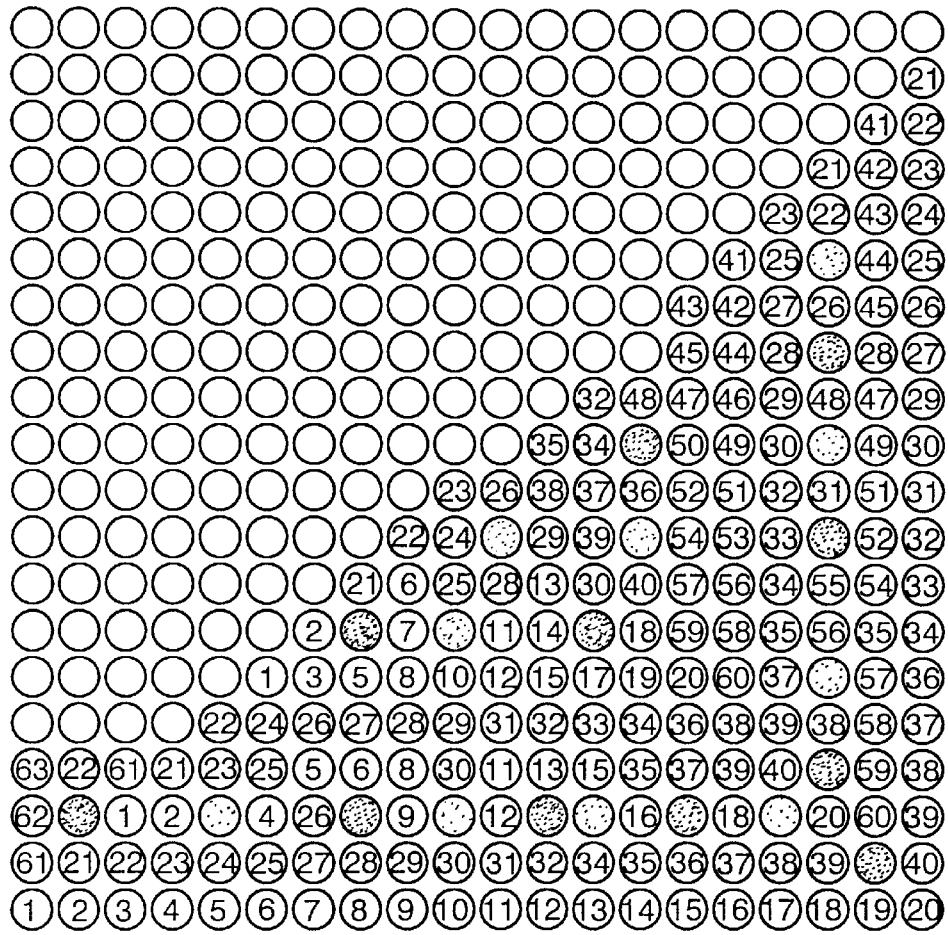

Again as a detail, FIG. 5 shows a distribution corresponding to FIGS. 3 and 4, in which contact surfaces also for earthing and current supply are taken into account in an exemplary manner. Again, the lowest line contains contact surfaces of the channels $a_1$ to $a_{20}$, namely those designated No. 1 to No. 20. The contact surfaces No. 21 to No. 40 are as sociated with the test channels $b_1$ to $b_{20}$. Contact surfaces with the numbers 41 to 60 are associated with the test channels $c_1$ to $c_{20}$. These contact surfaces are contained in sector B/C which extends from the right vertical edge of the illustration in FIG. 5 towards the centre in the manner of a triangle. It can be seen from FIG. 5, as already indicated above, how within the lower/right diagonal half of the raster plate 21 of FIG. three quarters of all available channels are present with contact surfaces distributed amongst one another.

Figure 6:
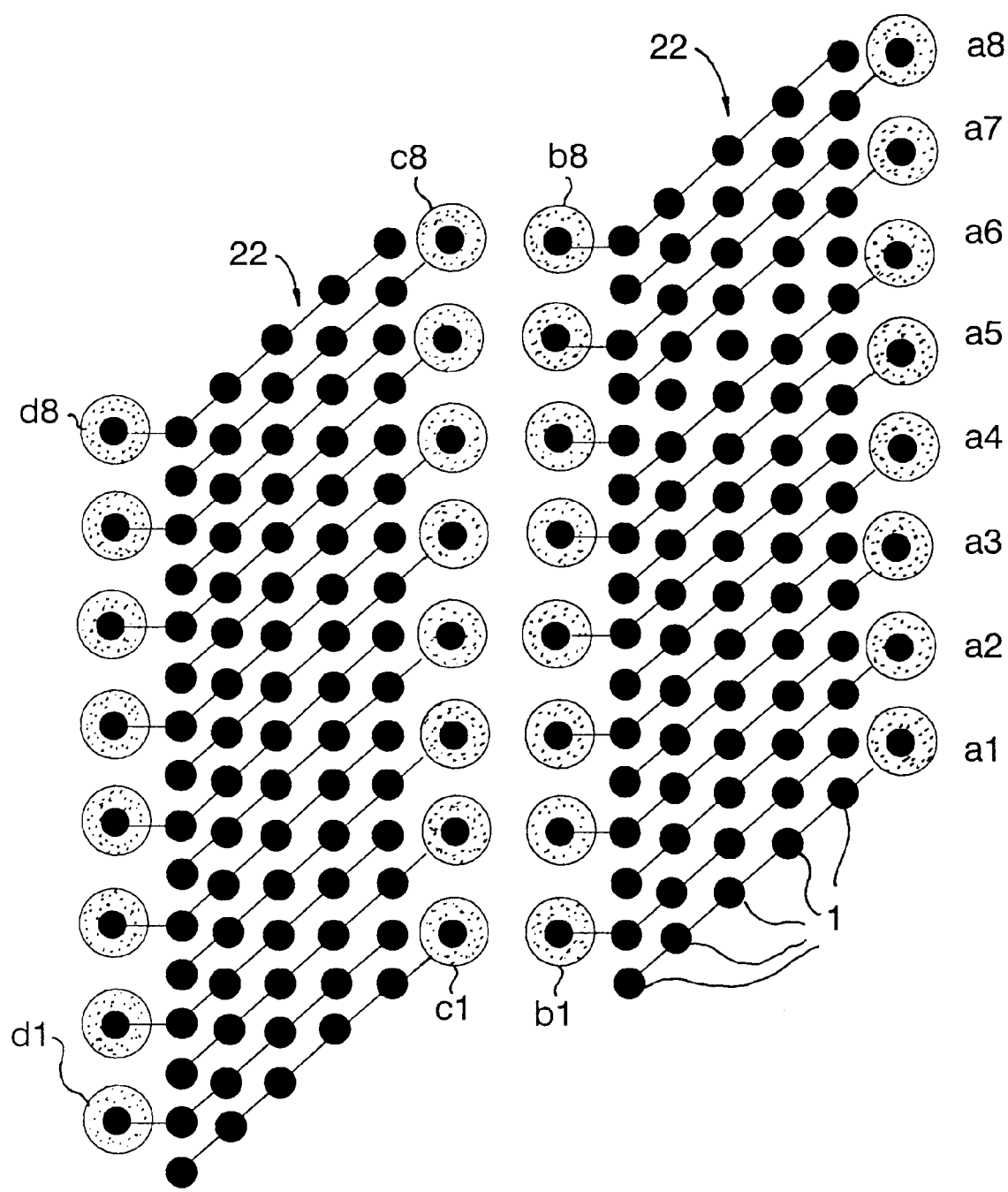
FIGS. 6 and 7 shown further schemes of modified, more specific distribution in accordance with the invention.
Figure 7:
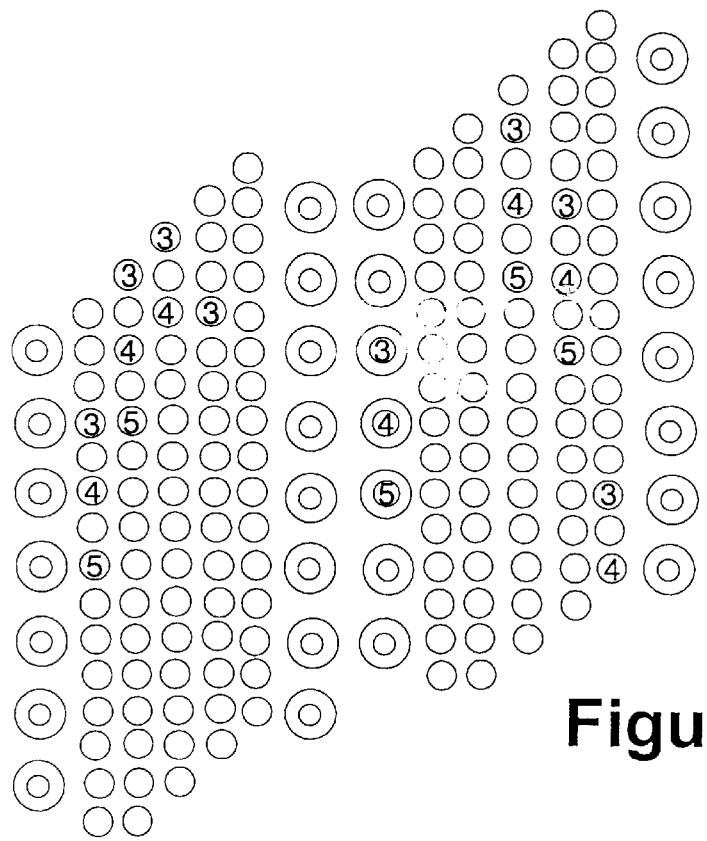

FIGS. 6 and 7 show a second example, additional to the example of FIGS. 3 to 5, of a distribution of the multiply present contact surfaces associated with the individual test channels. The scheme of FIG. 6 has a lesser uniformity of the distribution of the contact surfaces of the individual test channels , but has the advantage that the electrical connections of the individual distributed contact surfaces to their associated test channel terminals—to be provided on/in the raster plate—can be effected in a manner which keeps them relatively short. In FIG. 6, $a_1$ to $a_8$ designate the connections of eight test channels of a first group. The connections of test channels of further groups are designated with $b_1$ to $b_8$, $c_1$ to $c_8$ and $d_1$ $d_8$ . The contact surfaces associated with the individual test channels are represented by black filled points which, as can be seen from the Figure, are connected with their test channel terminal through short electrical paths. As can further be seen from the Figure, and requiring no further explanation, the contact surfaces of different test channels are distributed amongst one another in their vicinity. Such a less evenly distributed arrangement of the contact surfaces of the test channels is advantageous when very short connections between the test channel terminal and the test point 32 of the board is significant. Only the short conductor paths and the single spring contact pins form the overall length of the connection between test channel terminal and test point.

FIG. 7 shows a scheme very similar to that of FIG. 6 however with—as indicated by a few designations of the contact surfaces here represented not filled in black—a more extensive distribution of the contact surfaces amongst one another in comparison to FIG. 6. With the example of FIG. 7, however, the connections of the contact surfaces are in part already somewhat longer. It is to be considered for each individual case what degree of uniformity of the distribution on the one hand and on the other hand minimized length of the connections on/in the raster plate is more favourable for the solution of the individual problem.

In dependence upon the individual case, and also in dependence upon the number of the test points of a board in comparison with the overall number of available test channels, the situation can arise that for a test point 32 of the board there is available no suitable test channel in the neighbouring region (attainable with a single spring contact pin) This unavailability arises when all contact surfaces of the neighbourhood of such a test point belong to test channels which are already occupied at other places of the raster plate, namely because the test channels are present also at those other places with associated contact surfaces and are already contacted with other test points.

In accordance with a further development of the invention, the following solution of the problem is provided. If in a region of mutually neighbouring contact surfaces lying under the test point 32 no contact surface can be found whose test channel is still free, one can in a recursive manner seek in another region, in which one of these test channels is already contacted on its contact surface and occupied, for a possibility—through repositioning of this contact, i.e. by means of directing the spring contact pin located there to another contact surface of a test channel which is still free—to make free the previously occupied contact point. Thus, there is then provided in the first-mentioned region of the test point 32 a contactable contact surface. of a test channel which has now become free. Naturally, this selection, as will be described in more detail below, is calculated in advance "on paper", i.e. in terms of software, for example in a computer, and only then at the end are the guide hole plates 10, 11, 12 bored. Merely by way of further explanation it is mentioned that if e.g. in the first recursive step still no contact point, i.e. no test channel can be made free, one goes to another region in which the test channel of another contact surface of the region of the test point 32 can be made free. One can, however, effect an even further recursive making-free, recursively in the region in which one could not make free the desired test channel.

Figure 8:
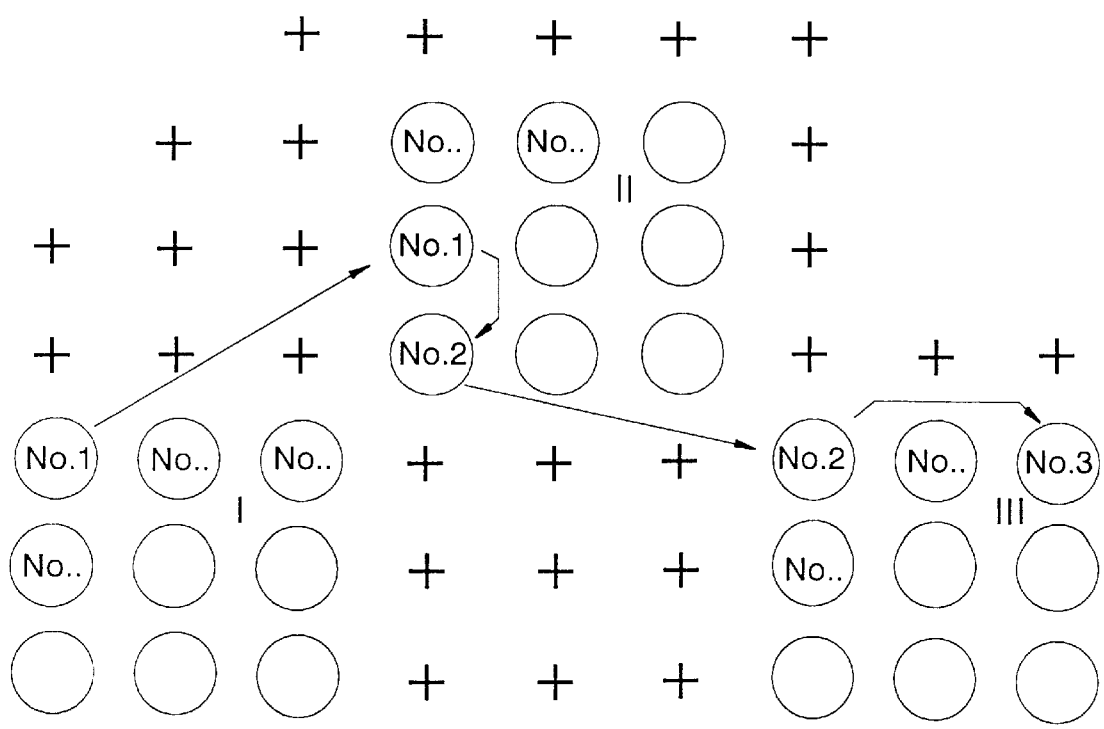
FIGS. 8 to 10 shown schemes and flow charts relating to a recursive adaptation of the distribution.

FIG. 8 serves for further explanation of the recursive process of the distribution algorithm. It is assumed that in the device in accordance with the invention a (respective) spring contact pin can be set obliquely up to the extent of one diagonal raster spacing 1 of the contact surfaces of the raster plate. It is further assumed that in the regions considered—the regions I, II and III illustrated in the Figure—the middle one of in each case nine mutually neighbouring contact surfaces is a ground terminal or a potential terminal. Now, if there arises the case that a test point 32 lying thereabove (see also FIG. 1) should be contacted with one of the test channel contact surfaces of field I by means of a spring contact pin and the test channels belonging to these further eight contact surfaces of the region I are already occupied elsewhere in the overall field of the contact surfaces of the raster plate, it is attempted for example to make free the contact surface No. 1, in that it is attempted—at that point of the overall raster plate at which the test channel belonging to this surface No. 1 is occupied—there to alter this occupation. If this occupation is present for example in region II, then in that region the contact surface No. 1 connected with this test channel is made free in that in the region II instead for example the (still free) test channel of contact surface No. 2 is occupied. Thus, since in the region II the contact surface 1 there—and thus the associated test channel—is now free, the contact surface 1 of the region I is then available for contacting with the spring contact pin which effects the connection with the test point 32 of the board. If, in an extreme case, the contact surface No. 1 in region II cannot be made free in the manner just described—because the test channels of all other illustrated contact surfaces are there likewise already occupied—one proceeds then to effect an altered occupation of the above kind in still a further region III, for example from the contact surface No. 2 to for example the contact surface No. 3, of another, still free test channel. This altered occupation makes free in region II the test channel of the local contact surface No. 2, namely thereby to make free in region II the test channel of contact surface No. 1. This is the recursive procedure. Naturally, one might instead attempt also the step I→III, namely to attempt directly in region III to make free the test channel of the contact surface No. 1 as explained: this however only when the region III includes a contact surface No. 1 associated with this test channel.

Figure 9:
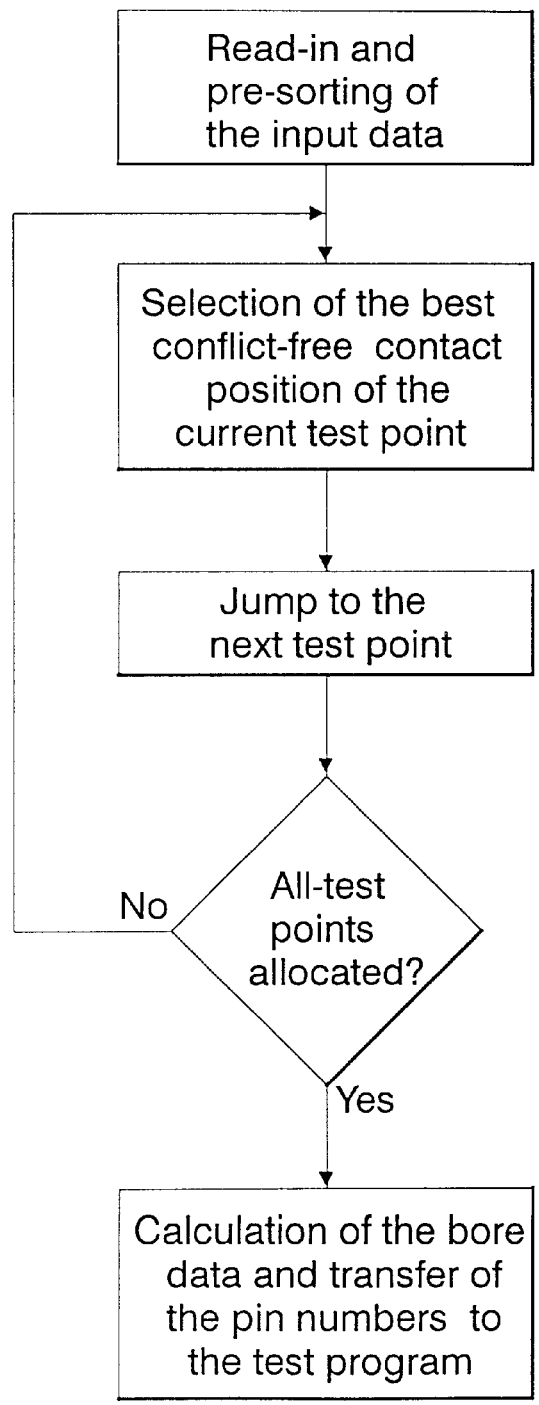
Figure 10:
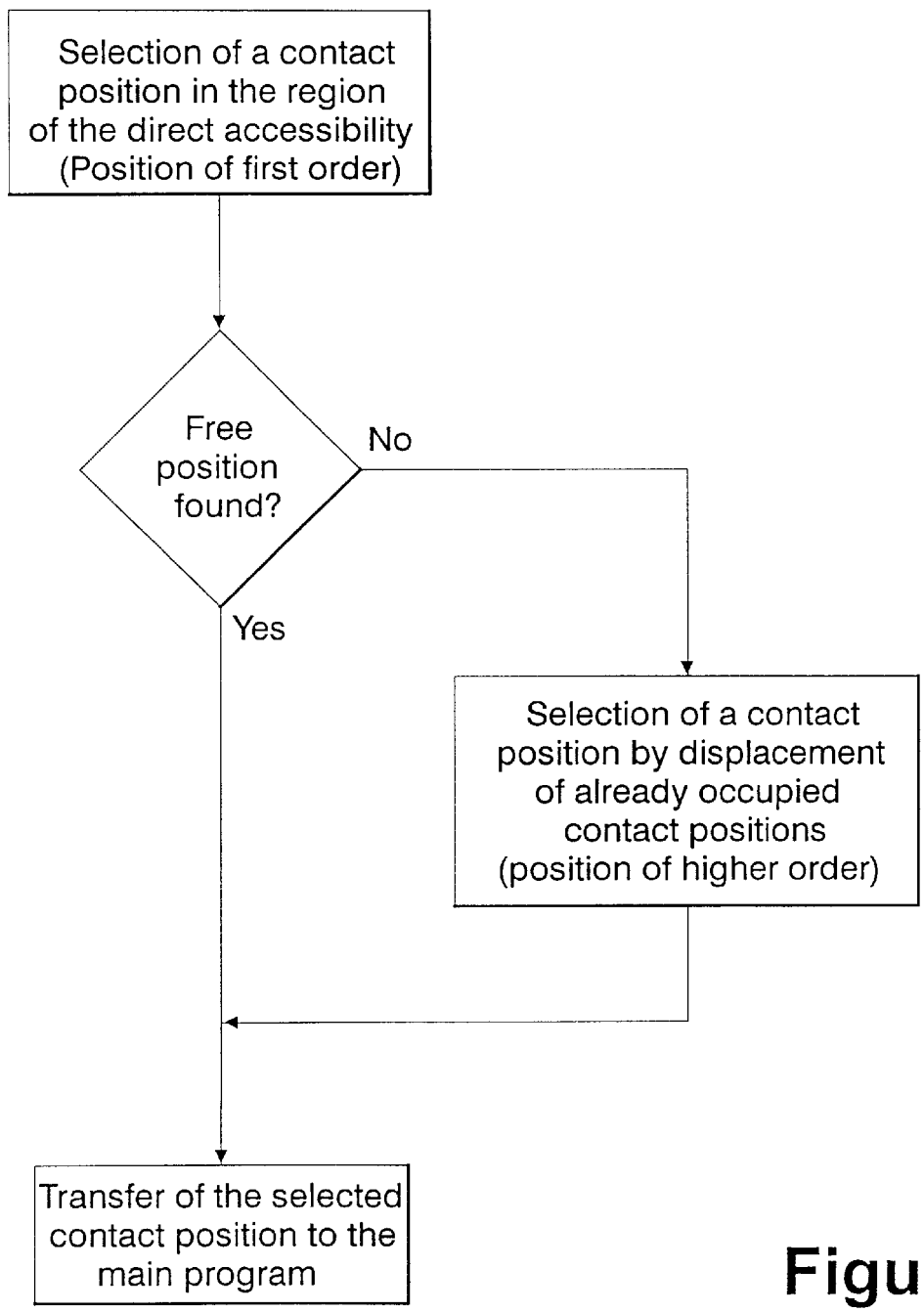

This only apparently complicated procedure is carried out by means of a computer, in which a corresponding selection and search program is entered. The flow chart scheme of FIG. 9 indicates such a program with reading-in and presorting of input data, whereby this data is the coordinates of the test points of the component assembly circuit board. The presorting takes into account for example criteria such as may be significant due to internal structures of the testing system. In the next step there is effected the selection of the best conflict-free contact position on the raster plate for a given test point. When this has been effected, there is effected the same selection for the test point next to be connected. If, finally, all test points are arranged, the calculation of the coordinates for the bores 13 in the guide hole plates 10, 11, 12 can be effected and can be carried through in further processing. If free test channels cannot be found for all test point contact surfaces, the program returns again to the selection step, in order to find better contact positions. The flow chart of FIG. 10 indicates the scheme of the already above-described recursive procedure. First, a selection of a contact position (in a region I) is made, which is attainable with an obliquely positioned spring contact pin. This is a position of a first order. If a free position is found, the scheme then immediately transfers the selected contact position to the main program of FIG. 9. If no free position can be found, there is effected a selection of a contact position by means of repositioning in another region II, III already having occupied contact positions (positions of higher order), namely in order to create a free position in the region of direct accessability (position of first order). Then the scheme transfers the selected position to the main program.

With test devices for which—as a result of their internal structure (e.g. multiplexed pin electronics)—certain restrictions with regard to the arrangement between test points and test channels are predetermined, then in the selection of the contact surfaces the rules predetermined by the manufacturer of the test device must be maintained. The selection procedure is effected in this case in the same manner. However, in the selection, in addition to the criteria that the test channel is not already occupied, the criteria is also considered as to whether the arrangement rules of the test device are fulfilled.

In an extreme case—such a case could for example appear in the region of a plug-in component group having many plug-in limbs—an auxiliary measure can be carried out which is shown in FIG. 11. This extreme case can appear more frequently when—in particular for electrical reasons—raster plates 21 are employed which for a predetermined number of contactable test channels have an n-multiple of this number of contact surfaces 22, with which the number n is selected to be less large. This measure is a spring contact pin pair having, however, in contrast to the state of the art, extraordinarily short electrical wire connection extending only over few raster lengths of the raster plate. The pin 202 provided on one side with a spring contact is connected via the conductive wire 205 with the second spring contact pin 203. At the respective other ends of the pins 202 and 203 there are provided electrically insulating bodies 204. The spring contact pins 202 and 203 there support themselves on the plates 21 and 12. With such a spring contact pin pair it is possible to bridge over several raster lengths, in contrast to which with the generally provided obliquely directed spring contact pins 2 and 3 only a displacement as far as plus/minus one or two raster lengths (transversely and in the diagonal) can be effected. This auxiliary measure does not conflict with the principle in accordance with the invention because on the one hand it serves only to offer a solution for cases appearing solely in special situations and on the other hand is compatible with regard to the guide hole plate of the adapter part provided in accordance with the invention.

With the invention there are to be provided, as already mentioned several times above, electrical connections in/on the raster plate 21 from the contact surfaces 22 located on its outer surface to points, e.g. to the mentioned contacting surfaces 27. It is particularly expedient to effect these connections as conductor paths.

Figure 12:
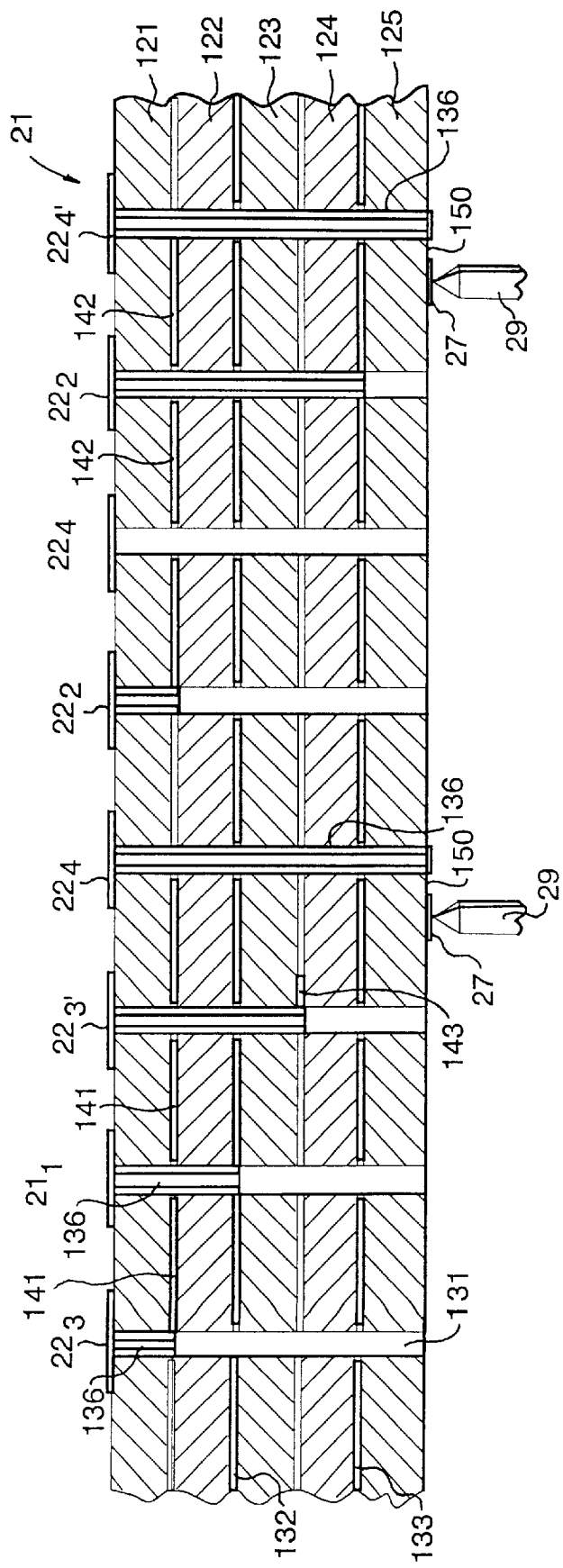
FIG. 12 shows a preferred construction of the raster plate in accordance with the invention.

FIG. 12 shows, in sectioned side view, a raster plate 21 of a multi-layer construction, provided in accordance with a further development of the invention. Again, the contact surfaces provided on the external surface (here upper surface) of the raster plate 21 are designated with 22. 121 to 125 designate layers or the like of electrically insulating material. The raster plate 21 has bores, designated by 131, associated with the contact surfaces 22. Between the layers 122 and 123, and between 124 and 125 there are provided in this example metallisations 132 and 133 which extend continuously over the surfaces, which metallisations are provided for the connection and delivery of ground potential and current supply potential Vcc. Between the layers 121 and 122 on the one hand and between 123 and 124 on the other hand there are illustrated a number of conductor paths 141, 142, 143. In order for example to electrically connect the contact surface 22, with the metallisation 132, namely with the ground connection, it is provided that the bore 131 belonging to this contact surface $22_1$ is metallized on its inner walls in such a manner that, and the metallisation 132 is brought so far up to this bore that, via this internal metallisation 136 of the bore electrical connection is established between the metallisation 131 and the contact surface $22_1$. The like applies to the contact surface $22_2$ with an internal wall metallisation of its associated bore 131 and a contact connection with the metallisation 133 of the Vcc terminal. There where no electrical connection from the metallisations 132/133 to contact surfaces 22 should be present, these metallisations are expediently removed or recessed in the shape of a ring, around the bores 131' concerned.

For, e.g. conductor path connections 141 and 142 running in the direction of the horizontals of the plane of FIG. 12, the plane between the layers 121 and 122 is for example reserved. There, for example contact surfaces are provided—designated on the one hand $22_3$ and $22_3$ and designated on the other hand $22_4$ and $22_{4'}$—which are each to be electrically connected by means of the conductor path connections 141 and 142. For this purpose, the internal walls of the bores 131 concerned are metallised, so that between the conductor path 141 and the respective contact surface there is an electrical connection. Further, the bores associated with the contact surfaces $22_{3'}$ and $22_{4'}$ are further electrically conductively metallised up to the associated contacting surface 27 of the respective contact tip 28 of the test device 29. It can be seen that therewith the electrical connection from the respective contacting surface 27, i.e. the terminal for the test channel of the tip 29, to the two electrically parallel connected contact surfaces $22_3$ and $22_{3'}$ is provided. The same applies for the contact surfaces $22_4$ and $22_{4'}$. This corresponds to an n=2-times multiplication of the test channel terminals on the outer surface of the raster plate 21. In accordance with the invention, in general the n-times multiplication is selected to be much greater.

The plane between the layers 123 and 124 is reserved, in similar manner, for conductor paths 143 which run in vertical direction with regard to the plane of FIG. 12, i.e. which in substance cross the direction of the connections 141/142.

Also for the conductor path connections 143 there are provided corresponding internal wall metallisations of the bores, for electrical connection of contact surfaces 22 with contacting surfaces 27.

Such conductor path connections 141, 142, 143, and also the connections of contact surfaces which are be brought to ground or Vcc potential with the ground-/Vcc-terminals are—in comparison with the wire connections employed in accordance with the state of the art in known test devices—sensitive with regard to overloading. In accordance with a further development of the invention, there are provided protection elements 150 for the conductor path connections of the raster plates. These may be protection elements in the manner of fuses, which are arranged for example on the lower outer surface of the raster plate 21 between the internal wall metallisation of a bore 131' and the respective contacting surface 27 (for the connection of the test tip 28). There, a blown fuse 150 can be repaired purposefully using known methods. Such overloadings can appear when a defective component assembly circuit board is tested.

This above-described configuration of raster plate 21 provided in accordance with an aspect of the invention may, as already mentioned in the introduction, be a separate adapter part for a known test device or may also be an integral part of a test device which is then new to this extent. In this case, the contacting surfaces 27 and the contact tips 29 of the test device—which contact tips represent a not insignificant cost factor—can be dispensed with and direct electrical wire connections from the terminals of the individual test channels to the internal wall metallisations of the respective bores 131' of the raster plate can be provided.

Above, a normal practice is mentioned; to act with suction on the component assembly circuit board 31 by means of vacuum and with the aid of atmospheric pressure to press the board onto the large number of spring contact tips, in order to ensure the desired contact between the test points of the board and these spring contact tips. For this purpose there is needed an upper plate 112 of the adapter which is stable against bending, such as is already shown in FIG. 2.

Figure 13:
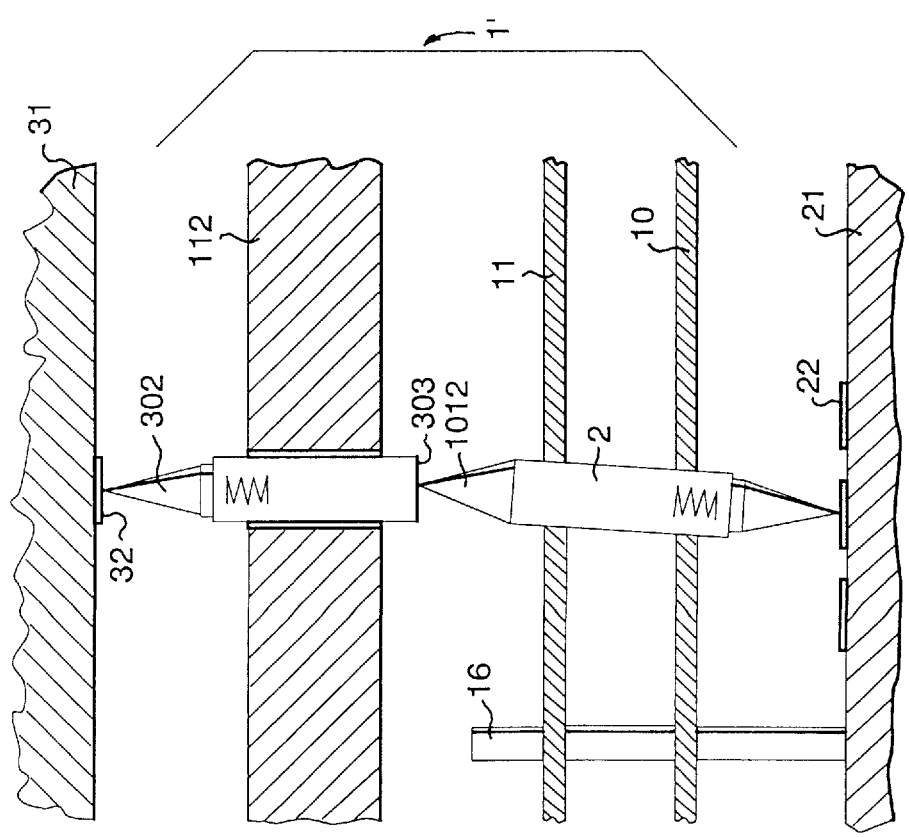

FIG. 13 shows an alternative configuration of spring contact pins to be employed in relation to the raster plate 21 in accordance with the invention. Similarly to the configuration of FIG. 2, there are provided spring contact pins 302 which are placed in the adapter plate 112 fixedly and vacuum-tight. With the upwardly projecting spring tips, these pins contact the respective test points of the board (as shown in FIG. 1). The opposite end of these spring contact pins 302 is formed as a contacting end 303. As shown in FIG. 1, the further contact connection to the contact surfaces 42 of the raster plate 21 is effected by means of spring contact pins 2, 3 of the above-described kind. These spring contact pins, guided by the hole plates 10, 11, 12 can—as with the example of FIG. 1—contact selected contact points 22 in oblique disposition. After use of this adapter, the spring contact pins 2 can be again removed in a simple manner from the hole plates 10, 11 forming the adapter part—which hole plates as with the example of FIG. 1 are placed in the test device, mechanically rigidly connected with one another—and can be further employed in another adapter. As in the state of the art, also the fixedly placed contact pins 302 can be again employed or further employed if one pulls them out of the plate 112 again.

A still further configuration for the invention is a primary to exclusive employment of spring contact pin pairs of similar form to that already shown in FIG. 11. As already mentioned above, such spring contact pin pairs are advantageously to be employed when the raster plate 21 in accordance with the invention has a not very large n-multiple number of the contact surfaces 42. Such spring contact pin pairs 202', 203 can be employed with short and with longer electrical connection wires 205. With the configuration illustrated in FIG. 14, the upwardly directed spring contact tips 202' are placed vacuum-tight in an adapter plate 112 which is sufficiently stable for suction of the board, and are retained in the plate.

Despite the employment of the spring contact pin pairs 202', 203' this configuration also offers most of the advantages which are provided due to the raster plate 21 in accordance with the invention having a multiplied number of contact points 22, namely with regard to the number of test tips of the test device which are present. Precisely as a result of the possibilities of access to contact surfaces 42—multiplied in accordance with the invention n-times in number and also distributed amongst one another—of the predetermined smaller number of test channels, this configuration using pin pairs also offers the advantage in each case of making do with very short connection wires 205.

Figure 14:
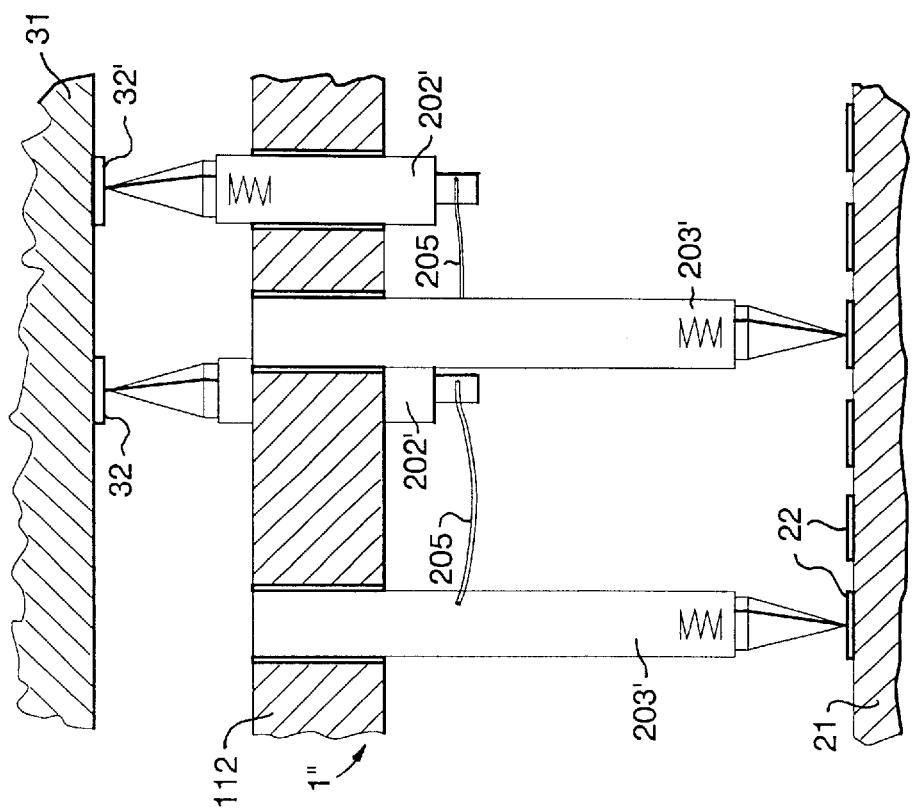
FIGS. 13 and 14 show further forms of configuration of the spring contact pin connections, in conjunction with a raster plate in accordance with the invention.

The above configurations provide in substance electrical wire connections between specifically provided (spring) pins only in individual cases or with individual positions (FIG. 11, 13 and 14). For the raster plate 21 there are preferably provided, corresponding to the examples so far described, conductor path connections between the contact surfaces 22 of one outer surface (upper surface) of this raster plate—generally present in n-times multiplicity—and the contact surfaces of the terminals 27 of the other (lower) outer surface.

However, for the manufacture and/or the employment of the raster plate—which is in accordance with the problem to be solved and in accordance with the invention universally employable—it may be advantageous to replace these conductor path connections either partially in particular completely by means of electrical wire connections. In particular with this measure there is reduced the effort required for the design of the connection pattern relevant to the invention, for the above-mentioned connections between in each case the n-multiplied contact surfaces 22, distributed over the one outer surface of the raster plate, with the associated respective contact surfaces of the terminals 27 of the other outer surface. In accordance with the invention, the parallel-connected contact surfaces 22, present n-times, which are associated with one contact surface of a respective terminal 27 of the other side of the raster plate, are positioned on the one outer surface of the raster plate within at least one region of this outer surface having further n-times contact surfaces, which in each case are associated with other contact surfaces of the terminals 27, mixed in with one another.

With wire connections there can namely be effected practically arbitrary electrically isolated crossings with wire connections of other contact surfaces, which is unfortunately not the case for conductor paths without further measures or can only be achieved in a complicated manner. Above all, with such wire connections there can be realized for the n-multiplied contact surfaces 22, associated with the respective terminals 27, even greater inter-mixing over even wider areas or over the entire surface of the raster plate 21.

Below, there will be described an example of an raster plate 21' in accordance with the invention having electrically contacting wire connections and a process for the manufacture of such a plate.

Figure 15A:
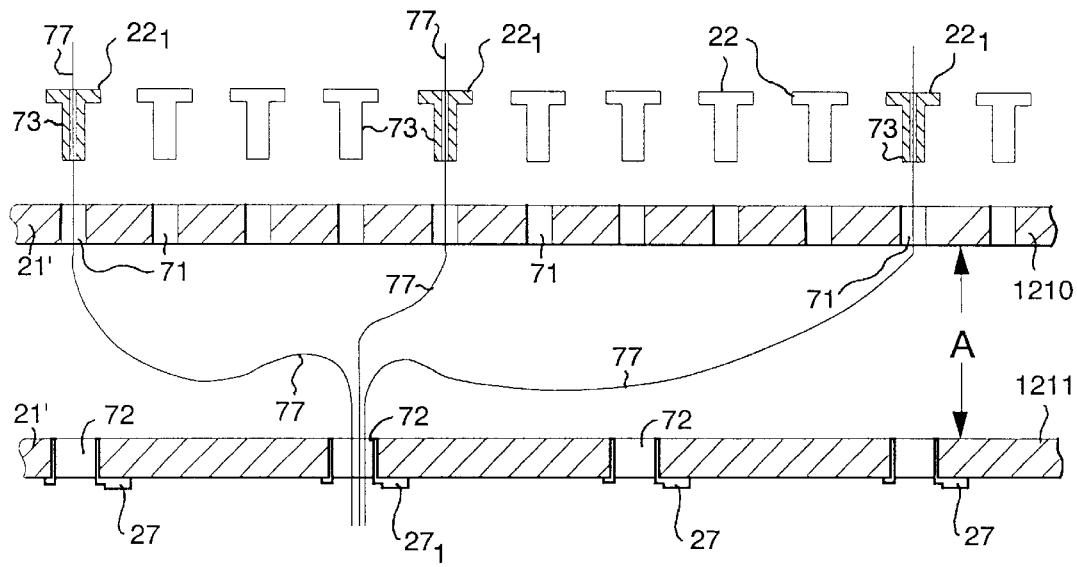
FIGS. 15 and 16 show further configurations.

FIG. 15a shows two plates 1210 and 1211 provided for a complete raster plate. The first 1210 of the two plates has bores 71 of the number of and freely selectable positioning of the contact surfaces 22 of a raster plate 21 employed for above-described examples. The second plate 1211 has the bores 72 which are present in a number corresponding to that of the contact surfaces of the terminals 27. The positions are predetermined as above by the (standardised) test device 28 and its contact pins 29.

In the initially larger spacing A of the two plates from one another, there are placed into the e.g. first plate 1210, as for example shown in FIG. 15a, into the prepared holes 71—preferably clamped in or pressed in—shaped contact pins 73 preferably having a head for a contact surface 22. Such a contact pin 73 has e.g. an axial bore in the pin part through which a thin conductor wire 77 is or is to be drawn. This wire is applied in or on the pin 73 in an electrically contacting manner, e.g. soldered on, and has an electrically insulating cover. Alternatively, the respective wire 77 can also be attached in a contacting manner solely at the (lower) end of the pin 73.

As illustrated in FIG. 15a, this respective wire 77 is or is to be further laid through a hole 72, determinable and to be selected, of the second plate 1211, whereby in general in each case there is provided a lateral offset, of greater or lesser size, of the hole 71 to the hole 72. In accordance with the provided or predetermined distribution of the contact surfaces 22—in accordance with the invention—in positions on the raster plate which are—in accordance with the invention—mixed with and amongst one another, here on the first plate, the wires of the pins or of the contact surfaces 22, which are namely present consequently in n-times multiple and which are associated in accordance with the invention with a respective contact surface 27 of the opposite outer surface of the raster plate, are taken to the respective hole 72 of the second plate, in particular are taken through this hole. The wires of the respective hole 72 are then attached and connected in electrically contacting manner, in particular soldered in, with the respective contact surface of the terminal 27, as will also be described in more detail below. Because of the n-times multiplicity of the contact surfaces 22 with regard to the contact surfaces 27 predetermined by the test device, there are taken to, e.g. through, each respective hole 72 of the second plate the number n of wires which are there consequently electrically connected with one another. FIG. 15 shows an example with n=3.

Figure 15B:
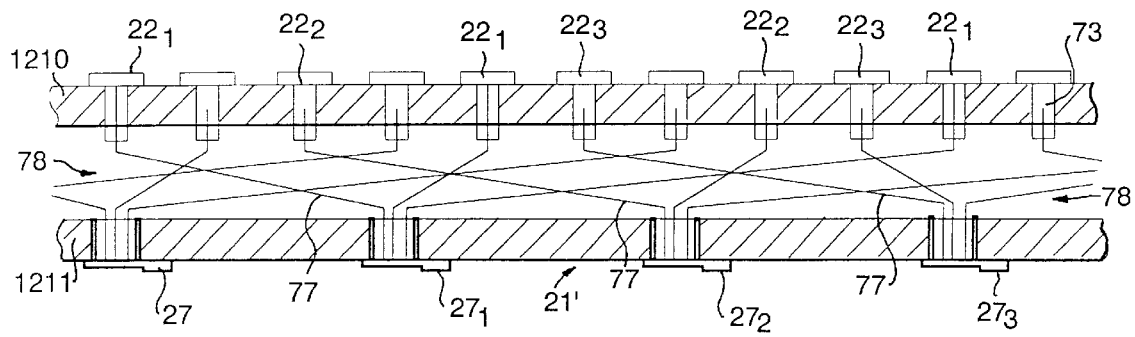

It can be seen from what is described above and from FIG. 15b that for the electrical connections of the n-multiple, parallel-connected, contact surfaces 22 of a group No. 1, No. 2, . . . with the respective contact surfaces of the terminals 27 which are associated with the contact surfaces 22 of such a group, in each case electrically connected therewith, there can be effected practically any arbitrary crossing connections of the wires 77. For ease of understanding and solely by way of example, FIG. 15b shows the wiring of individual contact surface $27_1$ and $27_2$ each with three pins or contact surfaces $22_1$ and $22_2$ positioned distributed amongst one another. In practice, there are located between two contact surfaces 22 of one group a multiplicity of contact surfaces 22 of other groups.

Expediently, after wiring of these two plates 1210 and 1211 has been effected as described, these plates are moved towards one another, i.e. their spacing A shown in FIG. 15a from one another is reduced. The wires 77 can then also be tightened by pulling and advantageously also the solder contacting to the contact surfaces of the terminals 27 is correspondingly only thereafter carried out. The intermediate space then still provided, with the connection wire 77 contained therein, can then be filled e.g. by casting in with casting resin 78, or there is effected some other fastening of the first and second plates with one another. This then provides a raster plate 21' equivalent to the raster plate 21. This raster plate 21' is equally universally employable, i.e. is not individually adapted to a particular circuit board to be tested, and can be variously employed just like the raster plate 21.

Figure 16:
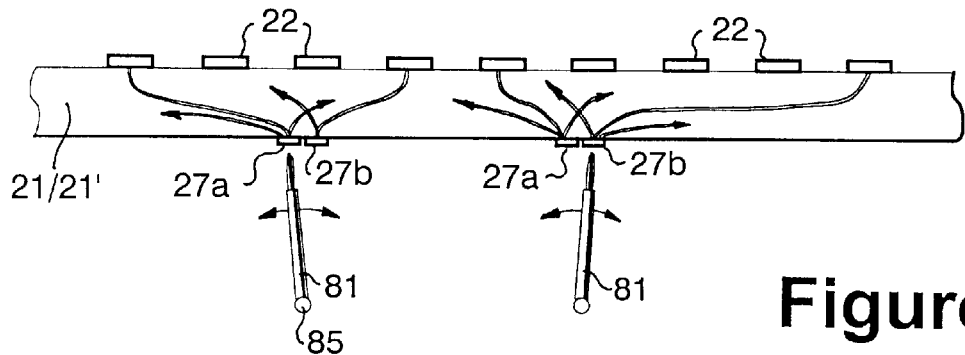

FIG. 16 shows a specific configuration which can be employed as a further development for in particular a configuration in accordance with FIG. 15b but which can also be used in accordance with configurations described earlier. In particular with very extensive mixing of the positionings of the contact surfaces 22 amongst one another—advantageous for universal applicability—it arises that corresponding to the lateral offset of a respective contact surface 22 to the associated contact surface of the terminal 27 relatively long connections are also necessary. This applies in particular for the measure with wiring connections as per FIGS. 15a/15b, with which practically unlimited mixing of the contact surfaces amongst one another is possible. Such long connections may, however, function as antennas and bring about capacitative disruptions of the individual test channels. This further development is advantageous in particular for cases with very high frequency test signals of the test device 28.

Figure 16A:
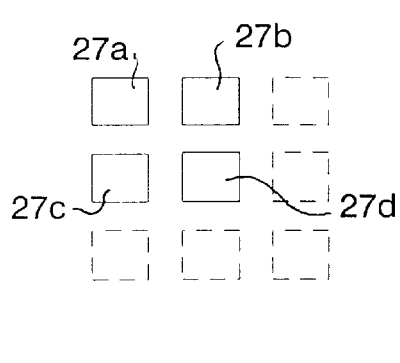

The further development in accordance with FIG. 16 provides, for dealing with such a case, to divide the contact surfaces of the terminals 27, as shown, into a plurality of part contact surfaces $27_x$ lying near to one another in the surface. In FIG. 16, in each case two part contact surfaces $27_1$ and $27_2$ are visibly illustrated, whereby two further part contact surfaces are hidden behind them. FIG. 16a shows in relation thereto, in a detail view from above, this exemplary four times division of a contact surface of a terminal 27.

With (spring) contact pins 81—as illustrated by way of example—which in accordance with this further development are preferably formed to be somewhat pivotably retained, preferably biaxially pivotably (as indicated in the Figure for one axis) there can be selectively set a connection between a respective one of the part contact surfaces $27_1$, $27_2$. . . to the test input 29 of the test device 28 concerned. Due to such a division of the contact surface of the terminal 27 it can be attained in accordance with the illustrated example that the respective connection provided from a test input 29 of the test device 28 to the selected contact 32 of the circuit board 31 to be tested is so formed that in each case only one quarter of the electrical connections present—e.g. the connection wires to the n-multiple contact surfaces 22 in the raster plate—are electrically connected to this test input 29. Thus, with this further development of the invention, only this one quarter of the n-multiple connections to contact surfaces 22 can in any event have a disruptive effect. Depending upon the effort required and/or the expediency of the measure there can be provided a more extensive division. Such part contact surfaces $27_1$ . . . are most sensibly or as a rule divided in the outer surface of the raster plate correspondingly two-dimensionally, e.g. four times, five times, nine times and the like, at a close spacing from one another. It is expedient to provide a biaxial joint 82 or the like for each respective pin 81.

Figure 16B:
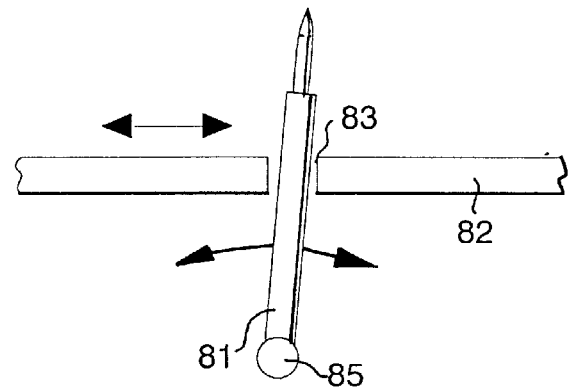

The pivotable pins 81 are (as FIG. 16b shows as a detail for one pin) held in a guided manner, e.g. by means of an additional hole plate 82. This hole plate 82 is manufactured—in accordance with the selection of the used part contact surfaces in each individual case—with correspondingly positioned guide holes 83. This additional hole plate is no longer universally employable in the manner of the raster plate 21, 21'. This is, however, no restriction of the invention since the small outlay for the specific additional hole plate is largely balanced in the respective case of need through the advantage of reduced "antenna" effect.

The pivotable contact pins 81 are as a rule part of the test device 28 and the additional hole plate 82 is then employed for a specific circuit board together with the already described plates 10, 11, or is made available or stored for use in the respective case of employment.

There can also be provided an actuator-controlled selective directing of the pins 81. With the respective actuator there is attained an angle directing which can be controllably set e.g. by means of a program. Instead of storing a specific hole plate for a specific circuit board, in this case the specific control program of the pins 81 for a particular circuit board is stored.

FIGS. 3 to 5 relate to schemes for the mixing amongst one another of the positions of contact surfaces 22 associated with various terminals 27. With these examples, the pattern of distribution is conceived starting from the edge of the surface and running towards the middle. FIGS. 17a, 17b relate, in contrast, to a further new distribution scheme which provides internal lines to the individual group-wise n-multiple, parallel-connected, contact surfaces 22 of the outer surface of the universally employable raster plate, which lines run cross-wise of one another, in particular diagonally, in different planes of the raster plate.

FIGS. 17a and 17b show two planes having conductor paths 91 and 92. The scheme with the conductor paths 91 of one plane and the scheme of the conductor paths 92 of the other plane lie, in practice, one above the other in the raster plate 21. There are provided in the respective planes, as shown, electrical connections with respective terminals 93 from the respective line 91/92 to the contact bore 1133 concerned. These contact bores are seen in section in the Figures and they have internal metallisations as electrical conductors. These internal metallisations extend as a rule up to the outer surface of the raster plate on which the numerous contact surfaces 22 are located. By way of these metallisations of the bores 1133, a respective number of contact surfaces 22 of the outer surface of the raster plate 21 is thus already connected with the respective line 91/92 via respective terminals 93 (in the plane concerned). Additionally thereto, or contained under the contact surfaces 22, are bores to such contact surfaces as are provided for the ground terminal or the terminal of supply voltages Vcc, and which may also be connected in some other way, e.g. to still a further internal contacting plane of the raster plate 21.

Figure 17D:
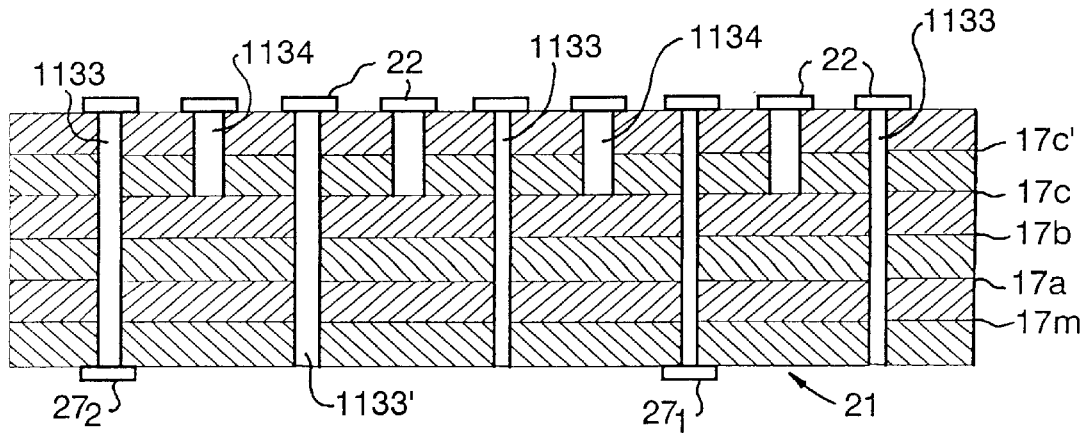
FIGS. 17 show the configuration of a further raster plate for particularly extensive mixing of the contact surfaces of the group with one another.
Figure 17A:
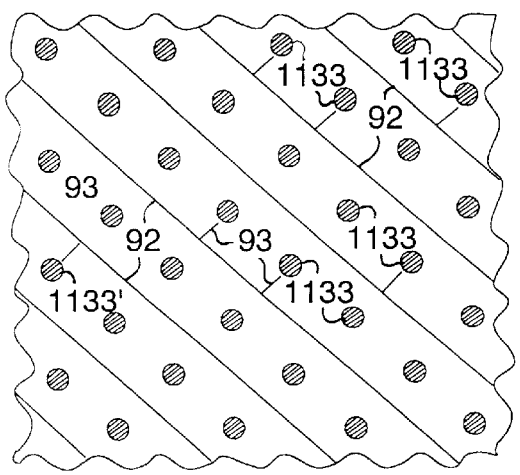
Figure 17B:
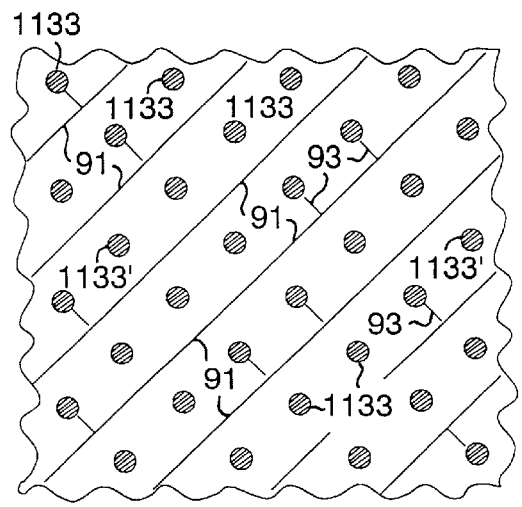
Figure 17E:
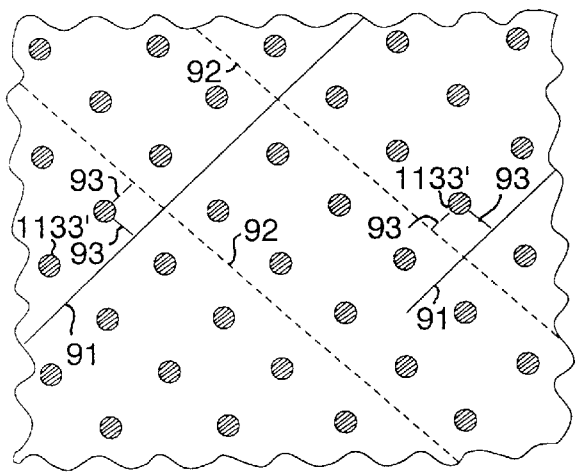
Figure 17C:
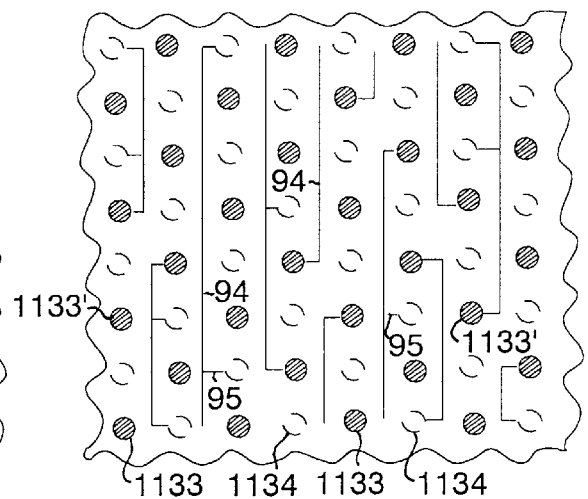

FIG. 17c shows a further plane, lying in the raster plate closer to the outer surface with the contact surfaces 22. FIG. 17c also shows in the illustration non-filled circles which in each case indicate the cross-section of further bores in the raster plate 21 which respectively extend less deeply. These bores 1134 extend e.g. only two layers deep into the plate and thus do not reach the planes of the connection lines 91/92. As can be seen, these further bores lie between the positions of the bores 1133 in the regular distribution of the provided contact surfaces 22 of the outer surface of the raster plate. With further connections 95 in this plane, as shown in FIG. 17c, individual bores 1133 are electrically connected with bores 1134 in the interior of the plate.

FIG. 17d shows in side view in pure schematic representation the disposition of above described planes of conductor paths and bores 1133 and 1134, as they are described above. The internal metallisations extend as far as the edges of the bores are illustrated with thick lines. It can be understood from the illustration of FIG. 17d how different contact surfaces 22 present on the outer surface of the raster plate 21 can be connected in the interior of the plate to the individual described planes i.e. to lines 91/92 present in these planes. Between the plane of FIG. 17c and the outer surface with the contact surfaces 22 there is indicated a further plane 17c' which may be additionally provided and which in its configuration corresponds in principal to FIG. 17c, but which however has conductor paths directed orthogonally to FIG. 17c. With 17m there is also taken into account a further metallisation plane (as mentioned above). It is to be noted that FIG. 17d can only give a schematic illustration since it cannot reproduce the second dimension of the plane, perpendicular to the illustration, over which there extends the distribution of connections of the internal metallisations of the different bores.

As can be seen from a comparison of FIG. 17a to 17d, the conductor lines 91/92 run in the raster plate at locations of the bores 1134 beneath the depth of those bores. Due to the lesser depth of the bores 1134 and the greater depth of the bores 1133, with this configuration of the raster plate in accordance with the invention, there can be obtained space for the conductor paths 91/92 running diagonally (FIG. 17a/17b) to the raster of the contacts 22, whereby these conductor paths can in each case run from edge to edge of the entire raster plate, but can also, however, (as FIG. 17a/17b show) be electrically interrupted.

FIG. 17e shows how a respective bore 1133' can also serve as connection of a conductor path 91 of the one plane with a conductor path 92, running at right angles thereto, of the corresponding other plane. With such internal connections between transversely running conductor paths 91 and 92 of the two planes, the n-multiple contact surfaces of a respective group—distributed over the entire surface of the raster plate (associated with a respective terminal 27) can be electrically connected with one another and with this associated terminal 27 despite greater spacings amongst them one from another.

It is apparent that in accordance with such a principle the most extensive freely selectable connections of lines 91/92 via bore contacts and lines 93, 94 and 95 can be provided, in order to be able to arrange the contact surfaces 22 of the outer surface of the raster plate—which are group-wise (No. 1, No. 2. . .) associated with a respective other terminal 27—practically arbitrarily mixed amongst one another, positioned distributed over this outer surface. Despite the small raster of contact surfaces 22, this configuration offers sufficient space for the numerous conductor paths.

The contact surfaces of the terminals 27 are located at the (in the Figures) underside of the plate. These terminals are electrically connected with respective ones of the through-going bores 1133 which are metallised as far as the underside of the plate.

With the invention, and in particular with the particularly advantageous above-described multilayer distribution scheme, having crossing conductor paths 91 and 92, there can be found practically in any partial region of the overall upper surface of the raster plate containing the contact surfaces 22 a contact surface which makes it possible to realize a connection from an arbitrarily positioned test point 32 of a specific circuit board 31 by way of spring contact pins 2, 3 (see also FIG. 1) to a test input 29 of the test device 28, even when this test input (as seen in FIG. 1) is significantly laterally offset relative to the specific test point 32 of the circuit board 31. As a result of the intermixed n-multiple presence of contact surfaces of a respective terminal 27 or of a respective test input 29 there is made available the possibility of contacting connection from practically any point of the circuit board to any input of the test device. This is made possible by means of the raster plate 21, 21' which is universally employable due to the configuration in accordance with the invention. To emphasize the fact once again, this raster plate is not restricted to employment with a specific circuit board and not restricted to employment with a specific test device whereby, with regard to the relationship of raster plate and test device to one another there must be present a correspondence of the raster of the terminals 27 with the raster of the test inputs 29.

What is claimed:

1. Adapter system for a test device (28) for loaded component assembly circuit boards (31), comprising:

an adapter part (1') with spring contact pins (2, 3) which are provided for contacting connection of a respective test point (32, 32') of the loaded component assembly circuit board (31) with a respective selected test channel contact (29) of a test channel ($a_1, a_2, \ldots b_1, \ldots c_1, \ldots$) of the test device (28), a raster plate (21, 21') having electrical contact surfaces (22) arranged on its first outer surface, facing the loaded component assembly circuit board (31), and having test channel terminals (27) for the test channel contacts (29) of the test channels ($a_1, a_2, \ldots b_1, \ldots c_1, \ldots$) of the test device (28) to be used on a second outer surface which is oriented opposite to the first outer surface of the raster plate (21, 21'), and electrical connections, provided on the surface or inside the raster plate (21, 21') from electrical contact surfaces (22) of the first outer surface of the raster plate (21, 21')

with respective test channel terminals (27) of the second outer surface of the raster plate (21, 21') respectively associated with such electrical contact surfaces (22), wherein with reference to the number of test channel terminals (27) of the test channels ($a_1$, $a_2$, ... $b_1$, ... $c_1$, ...) of the test device (28) present on the second outer surface, on the first outer surface of the raster plate (21, 21') the number of the electrical contact surfaces (22) is multiplied and in each case a n-times multiple number of these electrical contact surfaces (22) is respectively has a group (No. 1, No. 2, ...) electrically parallel-connected with one another and is connected with a selectively associated test channel to form a group (No. 1, No. 2. ..), wherein at least in regions of the first outer surface of the raster plate (21, 21') the individual electrical contact surfaces (22) of some of these groups (No. 1, No. 2. . .) and thus of some of the test channels ($a_1$, $a_2$, ... $b_1$, ... $c_1$, ...) are positioned distributed extensively mixed amongst one another in such a manner, that an universal applicability of the raster plate (21, 21') is guaranteed.

2. Adapter system for a test device (28) according to claim 1, characterized in that,
the raster plate (21, 21') is an additional adapter pan (1) to the test device (28).

3. Adapter system for a test device (28) according to claim 1, characterized in that,
the raster plate (21, 21') is an integral part of the test device (28) and a respective n-times multiple number of the electrical connect surfaces (22) are direct electrical parallel terminals of a respective one of the test channels ($a_1$, $a_2$, ... $b_1$, ... $c_1$, ...).

4. Adapter system for a test device (28) according to claim 1, characterized in that,
electrical connections of the test channel terminals (27) of the test channel contacts (29) of the test channels ($a_1$, $a_2$, ... $b_1$, ... $c_1$, ...) with their respectively associated electrical contact surfaces (22) on the surface or inside the plate (21) are effected as metallisations or conductor paths (131, 141, 142, 143).

5. Adapter system for a test device (28) according to claim 1, characterized in that,
the raster plate (21) includes metallisations (132, 133) extending over surface areas within a layer construction, as ground/potential supply lines.

6. Adapter system for a test device (28) according to claim 4 or 5, characterized in that,
overload protection elements (150) are included in the connections of the electrical contact surfaces (22) with the test channel terminals (27).

7. Adapter system for a test device (28) according to claim 1, characterized in that,
electrical contact surfaces (22) with which a number of test channels ($a_1$, $a_2$, ... $b_1$, ... $c_1$, ...) is associated whereby these test channels ($a_1$, $a_2$, ... $b_1$, ... $c_1$, ...) are a selection a, b of the available test channels ($a_1$, $a_2$, ... $b_1$, ... $c_1$, ...) are positioned distributed mixed amongst one another in a region (A/B) of the field of the raster plate (21, 21') and in another region (B/C) electrical contact surfaces (22) of test channels ($a_1$, $a_2$, ... $b_1$, ... $c_1$, ...) of another selection b, c of the available test channels ($a_1$, $a_2$, ... $b_1$, ... $c_1$, ...) are positioned distributed mixed amongst one another, so that in both regions (A/B, B/C) electrical contact surfaces (22) of the selection b are mixed with either electrical contact surfaces (22) of the selection a or of the selection c.

8. Adapter system for a test device (28) according to claim 7, characterized in that,
electrical contact surfaces (22) of the one selection a and of the other selection b are arranged mixed with one another line-wise.

9. Adapter system for a test device (28) according to claim 1, characterized in that,
for particularly short connections of electrical contact surfaces (22) with the associated test channel terminals (27) of the test channel contacts (29) in/on the raster plate (21, 21') in substance electrical contact surfaces (22) only of a number of test channels ($a_1$, $a_2$, ... $b_1$, ... $c_1$, ...) arranged neighboring one another are arranged distributed mixed with one another.

10. Adapter system for a test device (28) according to claim 1, characterized in that,
the size of the multiple n of the number of parallel-connected electrical contact surfaces (22) of each respective group (No.1, No.2, ... No.21, ... No.41, ...) of each test channel ($a_1$, $a_2$, ... $b_1$, ... $c_1$, ...) is chosen to be of different magnitude.

11. Adapter system for a test device (28) according to claim 1, characterized in that,
the adapter van (1') includes, for the guiding also of obliquely set spring contact pins (2, 3), a plurality of guide hole plates (10, 11, 12) arranged parallel spaced apart from one another, in which guide hole plates bores (13) for the predetermined guiding of the spring contact pins (2, 3) placed therein are provided.

12. Adapter system for a test device (28) according to claim 1, characterized in that,
the adapter part (1') includes a holding plate (112) for the retention of the spring contact pins (102) and at least one guide hole plate (10, 11) for the guiding of the spring contact pins (102).

13. Adapter system for a test device (28) according to claim 12, characterized in that,
bendable spring contact pins (102) are employed, the bendable portion of which is guided.

14. After system for a test device (28) according to claim 1, characterized in that,
in addition to the normally provided spring contact pins (2, 3, 102), there is provided a spring contact pin pair whose single spring contact pins (202, 203) are connected together by a short wire connection (205).

15. Adapter system for a test device (28) according to claim 1, characterized in that,
there is provided an adapter (1") which contains spring contact pin pairs, the spring contact pins (202', 203') of which that respectively belong together being electrically connected with wire connections (205), whereby in each case one spring contact pin (203') of these spring contact pins (202', 203') is spring-contacted with an electrical contact surface (22) of the raster plate (21) and the respective other spring contact pin (202') is spring-contacted with the respective test point (32, 32') of the loaded component assembly circuit board (31).

16. Adapter system for a test device (28) according to claim 1, characterized in that,
the adapter part (1') in a holding plate (112) in which the spring contact pins (302) for spring contacting of the test points (32) of the loaded component assembly circuit board (31) are so placed that the respective spring contact pin (302) forms on the side of the holding plate (112) averted from the loaded component assembly circuit board (31) a contact point (303), and spring contact pins (2, 3) are provided which are guided with the guide hole plates (10, 11, 12).

17. Adapter system for a test device (28) according to claim 1, characterized in that, the raster plate (21) is constructed with a plurality of layers with a plurality of planes (17a, 17b, 17c,. . .) and has through-going bores (1133) and only one or a few bores (1134) extending less deeply, in that in respective planes beneath the less deeply extending bores (1134) there are provided respective parallel running conductor paths (91, 92) which are directed transversely to one another in respective two different planes (17a, 17b, 17c. . .) lying one above the other and which extend below the less deeply extending bores (1134) between the through-going bores (1133) and in that these bores (1133, 1134) each have internal metallisations which are dimensioned suitably for the respective electrical connections, in order to provide connection contacts between conductor paths of different planes (17a, 17b, 17c. . .) and the electrical contact surfaces (22) which are located on the from outer surface of the raster plate (21) and the contact surfaces of the test channel terminals (27) which are located on the second outer surface of the raster plate (21).

18. Adapter system for a test deice (28) according to claim 1, characterized in that, there is provided a master plate (21') which has as electrical connections between the electrical contact surfaces (22) of the first outer surface of the raster plate (21') and the contact surfaces of the test channel terminals (27) of the second outer surface of the raster plate (21') in substance wire connections (77), and in that the raster plate (21') includes two planes (1210, 1211) which are arranged lying one above the other and of which the one plate (1210) has a field with bores (71) in which pins (73) having electrical contact surfaces (22) are placed and of which the other plate (1211) has a field with bores (72) which are positioned corresponding to the test channel terminals (27), whereby these bores (72) are so dimensioned that wire connections (77) extending from the pins (73) having the electrical contact surfaces (22) can be led in n-times number through each respective bore (72) and can be connected with the respective test channel terminal (27).

19. Adapter system for a test device (28) according to claim 18, characterized in that, the intermediate space between the two plates (1210, 1211), in which the connection wires (77) run, is filled at least in part with casting resin in that these two plates (1210, 1211) as a unit form the raster plate (21').

20. Adapter system for a test device (28) according to claim 1, characterized in that, contact surfaces of the test channel terminals (27) for the contacting with the test channel contacts (29) of the test channels ($a_1, a_2, \ldots b_1, \ldots c_1, \ldots$) of the test device (28) located on the raster plate (21, 21') are electrically divided at least to some proportion respectively into a plurality of part contact surfaces (27a, 27b. . .), whereby these part contact surfaces (27a, 27b. . .) are arranged lying near to one another and the individual part contact surfaces (27a, 27b. . .) are electrically connected in each case only with a numerical proportion of those electrical connections which connect this test channel terminal (27) with the n-multiple electrical contact surfaces (22) of the first outer surface of the raster plate (21, 21') associated therewith, which numerical proportion corresponds to the division factor, and in that a device (81) for the selective contacting electrical connection of one of these part contact surfaces (27a, 27b. . .) with the test channel contact (29) of the test device (28) is provided.

21. Adapter system for a test device (28) according to claim 20, characterized in that, the device (81) has the shape of a pin and in that for the individual alignment of the pin there is provided an additional hole plate (82) having correspondingly positioned holes (83).

22. Adapter system for a test device (28) according to claim 21, characterized in that, for the individual setting of the pin there is provided an actuator.

* * * * *